US009450471B2

(12) United States Patent
Mergener et al.

(10) Patent No.: US 9,450,471 B2
(45) Date of Patent: Sep. 20, 2016

(54) BRUSHLESS DC MOTOR POWER TOOL WITH COMBINED PCB DESIGN

(71) Applicant: Milwaukee Electric Tool Corporation, Brookfield, WI (US)

(72) Inventors: Matthew J. Mergener, Germantown, WI (US); Michael Kolden, Wauwatosa, WI (US); William E. Check, Milwaukee, WI (US); Matthew P. Wychlendt, Delafield, WI (US); Andrew T. Beyerl, Brookfield, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 518 days.

(21) Appl. No.: 13/841,246

(22) Filed: Mar. 15, 2013

(65) Prior Publication Data
US 2013/0313925 A1 Nov. 28, 2013

Related U.S. Application Data

(60) Provisional application No. 61/651,137, filed on May 24, 2012, provisional application No. 61/684,982, filed on Aug. 20, 2012.

(51) Int. Cl.
*H02K 11/00* (2016.01)
*H02K 7/14* (2006.01)
(Continued)

(52) U.S. Cl.
CPC ............... *H02K 7/145* (2013.01); *B25F 5/00* (2013.01); *B25F 5/008* (2013.01); *H02K 11/215* (2016.01); *H02K 11/33* (2016.01); *B25B 21/02* (2013.01); *H02K 2211/03* (2013.01)

(58) Field of Classification Search
CPC ............. H02K 7/145; H02K 2211/03; H02K 11/0073; H02K 9/04; H02K 9/06; H02K 9/22; H02K 11/0021; B25F 5/00; B25F 5/008; B25F 21/02
See application file for complete search history.

(56) References Cited

U.S. PATENT DOCUMENTS 3,531,702 A 9/1970 Hill
3,678,358 A 7/1972 Kolatorowicz
(Continued)

FOREIGN PATENT DOCUMENTS

DE 2929259 1/1981
DE 102007011658 9/2008
(Continued)

OTHER PUBLICATIONS

International Search Report and Written Opinion for Application No. PCT/US2013/055587 dated Nov. 21, 2013 (13 pages).
(Continued)

*Primary Examiner* — Burton Mullins
(74) *Attorney, Agent, or Firm* — Michael Best & Friedrich LLP

(57) ABSTRACT

A power tool with a combined printed circuit board (PCB) that reduces internal wiring of the power tool and provides a large amount of air flow to internal components. In some instances, the combined PCB has a surfboard shape and includes a motor control unit and power switching elements (Field Effect Transistors or FETs). The combined surfboard PCB is located above the trigger, but below the motor and drive mechanism. In other instances, the combined PCB has a doughnut shape and is located coaxially with a motor shaft. The combined PCB may be positioned between a doughnut-shaped control PCB and the motor.

20 Claims, 23 Drawing Sheets

(51) Int. Cl.
*B25F 5/00* (2006.01)
*B25B 21/02* (2006.01)

(56) References Cited

U.S. PATENT DOCUMENTS

| | | |
|---|---|---|
| 3,783,359 A | 1/1974 | Malkiel |
| 4,619,624 A | 10/1986 | Kerr, III et al. |
| 5,115,175 A | 5/1992 | Fletcher |
| 5,148,349 A | 9/1992 | Kogure et al. |
| 5,235,261 A | 8/1993 | Philipp |
| 5,747,953 A | 5/1998 | Philipp |
| 5,753,173 A | 5/1998 | Leonard et al. |
| 6,013,991 A | 1/2000 | Philipp |
| RE36,820 E | 8/2000 | McGinley et al. |
| 6,123,158 A | 9/2000 | Steffen |
| 6,320,286 B1 | 11/2001 | Ramarathnam |
| 6,431,879 B2 | 8/2002 | Brekosky et al. |
| 6,434,013 B2 | 8/2002 | Kitamura et al. |
| 6,538,403 B2 | 3/2003 | Gorti et al. |
| 6,552,904 B2 | 4/2003 | Fung |
| 6,570,284 B1 | 5/2003 | Agnes et al. |
| 6,577,030 B2 | 6/2003 | Tominaga et al. |
| 6,585,246 B2 | 7/2003 | McCormick et al. |
| 6,644,638 B1 | 11/2003 | McCormick |
| 6,765,317 B2 | 7/2004 | Chu |
| 6,791,219 B1 | 9/2004 | Eric et al. |
| 6,794,594 B2 | 9/2004 | Ching |
| 6,799,282 B2 | 9/2004 | Maeda et al. |
| 6,866,105 B2 | 3/2005 | Pfisterer et al. |
| 6,883,795 B2 | 4/2005 | McCormick et al. |
| 6,895,750 B2 | 5/2005 | Ando et al. |
| 6,920,047 B2 | 7/2005 | Privett et al. |
| 7,000,911 B2 | 2/2006 | McCormick et al. |
| 7,046,518 B2 | 5/2006 | Golightly et al. |
| 7,064,462 B2 | 6/2006 | Hempe et al. |
| 7,121,539 B2 | 10/2006 | McCormick et al. |
| 7,208,943 B2 | 4/2007 | Godoy et al. |
| 7,259,531 B1 | 8/2007 | Liu |
| 7,312,545 B2 | 12/2007 | Sasaki et al. |
| 7,330,006 B2 | 2/2008 | Iwata et al. |
| 7,359,628 B2 | 4/2008 | Broghammer et al. |
| 7,371,150 B2 | 5/2008 | Deshpande et al. |
| 7,375,287 B2 | 5/2008 | Rathmann |
| 7,400,106 B2 | 7/2008 | DeCicco et al. |
| 7,521,826 B2 | 4/2009 | Hempe et al. |
| 7,547,123 B2 | 6/2009 | Kittredge et al. |
| 7,564,208 B2 | 7/2009 | Bailey et al. |
| 7,638,958 B2 | 12/2009 | Philipp et al. |
| 7,643,296 B2 | 1/2010 | Yamada et al. |
| 7,646,155 B2 | 1/2010 | Woods et al. |
| 7,673,701 B2 | 3/2010 | Tanaka et al. |
| 7,703,330 B2 | 4/2010 | Miyazaki et al. |
| 7,733,054 B2 | 6/2010 | Phillips et al. |
| 7,834,566 B2 | 11/2010 | Woods et al. |
| 7,990,005 B2 | 8/2011 | Walter et al. |
| 8,069,572 B2 | 12/2011 | Dreher |
| 8,084,901 B2 | 12/2011 | Oomori et al. |
| 8,253,285 B2 | 8/2012 | Yoshida et al. |
| 8,405,260 B2 | 3/2013 | Takeyama et al. |
| 2002/0134811 A1 | 9/2002 | Napier et al. |
| 2003/0222516 A1 | 12/2003 | Cleanthous et al. |
| 2004/0112616 A1 | 6/2004 | Broghammer et al. |
| 2005/0121209 A1 | 6/2005 | Shimizu et al. |
| 2006/0052914 A1 | 3/2006 | Kubokawa et al. |
| 2006/0181857 A1 | 8/2006 | Belasy et al. |
| 2007/0228824 A1 | 10/2007 | Yasukawa et al. |
| 2007/0267990 A1 | 11/2007 | Abolhassani et al. |
| 2008/0041620 A1 | 2/2008 | Albanese et al. |
| 2008/0170841 A1 | 7/2008 | Schneider et al. |
| 2008/0179078 A1 | 7/2008 | Opsitos |
| 2009/0057006 A1 | 3/2009 | Kishibata et al. |
| 2009/0145621 A1 | 6/2009 | Lau et al. |
| 2009/0160468 A1 | 6/2009 | Lindsey et al. |
| 2009/0200961 A1 | 8/2009 | Straub |
| 2009/0272599 A1 | 11/2009 | Sekine et al. |
| 2009/0277682 A1 | 11/2009 | Bungo |
| 2009/0322149 A1 | 12/2009 | Kishibata |
| 2010/0001675 A1 | 1/2010 | Matsunaga et al. |
| 2010/0065295 A1 | 3/2010 | Aradachi et al. |
| 2010/0108341 A1 | 5/2010 | Casalena et al. |
| 2010/0123359 A1 | 5/2010 | Nisuikawa |
| 2010/0163266 A1 | 7/2010 | Matsunaga et al. |
| 2010/0253162 A1 | 10/2010 | Sakamaki et al. |
| 2010/0283332 A1 | 11/2010 | Toukairin et al. |
| 2010/0326804 A1 | 12/2010 | Saur |
| 2010/0327678 A1 | 12/2010 | Yamasaki et al. |
| 2011/0000688 A1 | 1/2011 | Iwata |
| 2011/0180286 A1 | 7/2011 | Oomori et al. |
| 2011/0187211 A1 | 8/2011 | Matsunaga et al. |
| 2011/0227430 A1 | 9/2011 | Omori et al. |
| 2012/0319509 A1 | 12/2012 | Kishima et al. |
| 2014/0132093 A1 | 5/2014 | Purohit et al. |

FOREIGN PATENT DOCUMENTS

| | | | |
|---|---|---|---|
| DE | 102008036393 | 2/2009 | |
| DE | 102008041725 | 3/2010 | |
| DE | 102008042799 | 4/2010 | |
| EP | 192469 | 8/1986 | |
| EP | 1374653 | 1/2004 | |
| EP | 1715565 | 10/2006 | |
| EP | 1683169 | 4/2007 | |
| EP | 1873800 | 1/2008 | |
| EP | 2050112 | 4/2009 | |
| EP | 2100702 | 9/2009 | |
| EP | 2103396 | 9/2009 | |
| GB | 2314980 | 1/1998 | |
| JP | 2003199310 A | 7/2003 | |
| JP | 2003209960 | 7/2003 | |
| JP | 2005304146 | 10/2005 | |
| JP | 2007-283447 | 11/2007 | |
| JP | 2009-240022 | 10/2009 | |
| JP | 2009285787 | 12/2009 | |
| WO | 2008/083667 | 7/2008 | |
| WO | 2009145205 | 12/2009 | |
| WO | WO 2009/145206 A2 * | 12/2009 | ................ B25F 5/00 |

OTHER PUBLICATIONS

Image of MAX-PJ-ID143 Brushless Impact Driver admitted prior art publicly available as early as Aug. 17, 2012.
MAX USA Corp, "PJID143", <http://www.maxusacorp.com/product_detail_html?productcode=PJ6103> webpage available as early as Feb. 19, 2012.
Image of Hitachi Brushless Power Tool, admitted prior art publicly available at least as early as Aug. 17, 2012.
Image of Makita BFH040 Impact Driver, admitted prior art publicly available at least as early as Aug. 17, 2012.
Bonfe et al., "A Brushless Motor Drive with Sensorless Control for Commercial Vehicle Hydraulic Pumps" Industrial Electronics, 2008, pp. 612-617.
Makita, Makita's top end 3-speed metal gear 3-mode combination Cordless Percussion Driver Drill BHP4515, admitted prior art publicly available as early as Aug. 17, 2012, 47 pages.

* cited by examiner

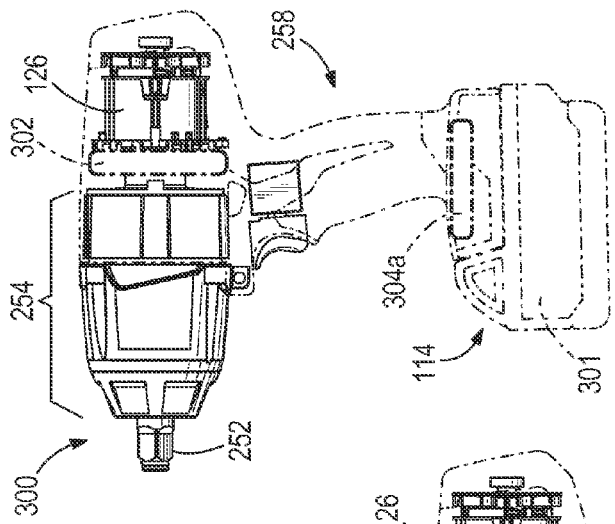
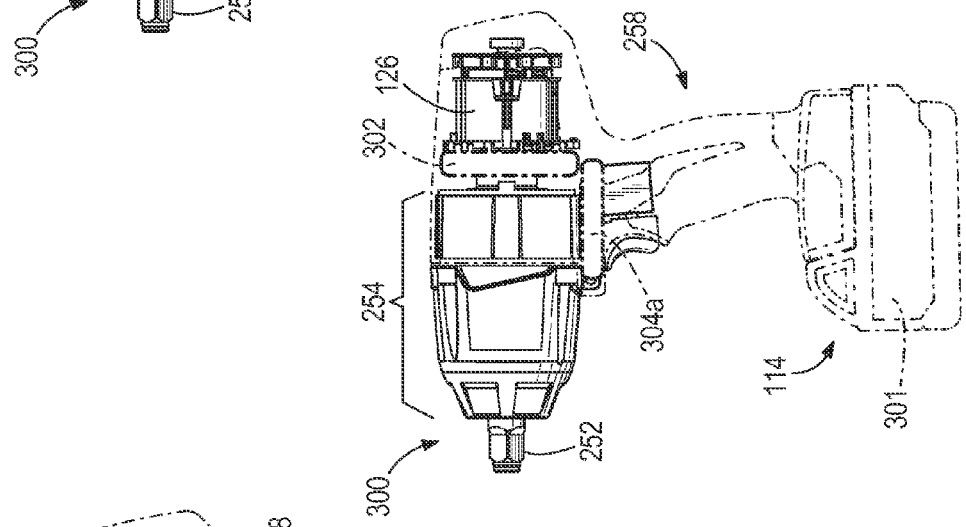
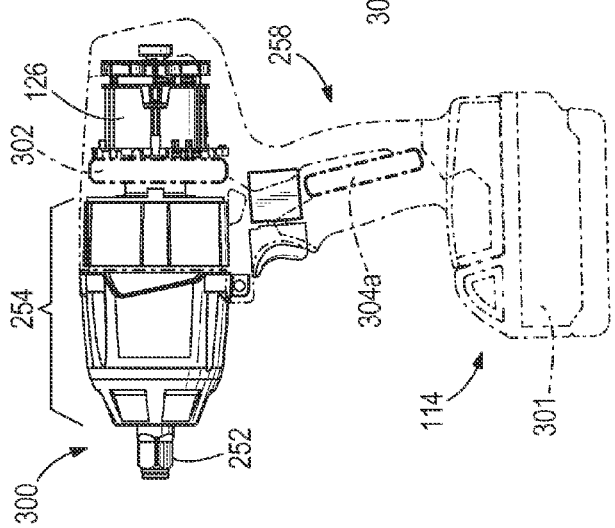
FIG. 22C
FIG. 22B
FIG. 22A

BRUSHLESS DC MOTOR POWER TOOL WITH COMBINED PCB DESIGN

RELATED APPLICATIONS

The present application claims priority to U.S. Provisional Application 61/651,137, filed May 24, 2012, and U.S. Provisional Application No. 61/684,982, filed Aug. 20, 2012, the entire contents of each of which are hereby incorporated by reference.

FIELD OF THE INVENTION

The present invention relates to brushless motor power tools.

BACKGROUND

Power tool motors can generally be grouped into two categories: brushed motors and brushless motors. In a brushed motor, motor brushes make and break electrical connection to the motor due to rotation of the rotor. In a brushless motor power tool, such as power tool 100 of FIG. 1, switching elements are selectively enabled and disabled by control signals from a controller to selectively apply power from a power source to drive the brushless motor. The power tool 100 is a brushless hammer drill having a housing 102 with a handle portion 104 and motor housing portion 106. The power tool 100 further includes an output unit 107, torque setting dial 108, forward/reverse selector 110, trigger 112, battery interface 114, and light 116.

FIG. 2 illustrates a simplified block diagram 120 of the brushless power tool 100, which includes a power source 122 (e.g., a battery pack), Field Effect Transistors (FETs) 124, a motor 126, hall sensors 128, a motor control unit 130, user input 132, and other components 133 (battery pack fuel gauge, work lights (LEDs), current/voltage sensors, etc.). The Hall sensors 128 provide motor information feedback, such as motor rotational position information, which can be used by the motor control unit 130 to determine motor position, velocity, and/or acceleration. The motor control unit 130 receives user controls from user input 132, such as by depressing the trigger 112 or shifting the forward/reverse selector 110. In response to the motor information feedback and user controls, the motor control unit 130 transmits control signals to accurately control the FETs 124 to drive the motor 126. By selectively enabling and disabling the FETs 124, power from the power source 122 is selectively applied to the motor 126 to cause rotation of a rotor. Although not shown, the motor control unit 130 and other components of the power tool 100 are electrically coupled to the power source 122 such that the power source 122 provides power thereto.

SUMMARY

The connections shown between components of the power tool 100 are simplified in FIG. 2. In practice, the wiring of the power tool 100 is more complex, as the components of a brushless power tool are interconnected by several wires for power and control signals. For instance, each FET of the FETs 124 is separately connected to the motor control unit 130 by a control line; each FET of the FETs 124 is connected to terminal of the motor 126; the power line from the power source to the FETs 124 includes a positive wire and a negative/ground wire; etc. Additionally, the power wires can have a large gauge/diameter to handle increased current, further occupying limited space within the power tool housing 102.

In sum, the various interconnections between components of a brushless power tool can lead to a complex wiring situation within the power tool housing, which has limited space for such wiring.

Embodiments of the present invention relate to the component layout of power tools having brushless motors. More particularly, embodiments relate to the positioning of various printed circuit boards and electronics of a brushless power tool within a housing of the power tool. The layout of power tools includes several design considerations, such as size, weight, and shape to ensure comfortable operation of the tool by a user. An efficient layout of components and wiring of a brushless power tool enables a more compact power tool, simplified tool assembly, improved thermal control (e.g., due to improved air flow), and other benefits.

In one embodiment, the invention provides a power tool including a housing and a brushless direct current (DC) motor within the housing. The brushless DC motor includes a rotor and a stator, wherein the rotor is coupled to a motor shaft to produce a rotational output. The power tool further includes a heat sink secured to an end of the brushless DC motor and a combined printed circuit board (PCB) having a Hall sensor, power switching elements, and a through-hole. The combined PCB is secured to the heat sink, and the motor shaft extends through the through-hole of the heat sink. The power tool also includes a control PCB having a motor control unit that receives motor positional information from the Hall sensor and controls the power switching elements to drive the brushless DC motor.

In another embodiment the invention provides a power tool including a housing and a brushless direct current (DC) motor within the housing. The brushless DC motor includes a rotor and a stator, wherein the rotor is coupled to a motor shaft to produce a rotational output. The power tool further includes an output unit coupled to the motor shaft to providing the rotational output outside of the housing, a combined printed circuit board (PCB), and a control PCB. The combined PCB includes a Hall sensor, power switching elements, and a through-hole, wherein the combined PCB is positioned between the brushless DC motor and the output unit and wherein the motor shaft extends through the through-hole. The control PCB includes a motor control unit that receives motor positional information from the Hall sensor and controls the power switching elements to drive the brushless DC motor.

In another embodiment the invention provides a power tool including a housing having a handle portion and a motor housing portion, and a brushless direct current (DC) motor within the motor housing portion. The brushless DC motor includes a rotor and a stator, wherein the rotor is coupled to a motor shaft to produce a rotational output. The power tool also includes a combined printed circuit board (PCB) having components exposed within the housing including a motor control unit and power switching elements. The combined PCB is positioned between the handle portion and the brushless DC motor, and the motor control unit controls the power switching elements to drive the brushless DC motor. The power tool further includes a fan positioned on a rear end of the brushless DC motor. The fan is rotatable by the brushless DC motor to generate a cooling air flow within the housing to cool the components of the combined PCB.

Other aspects of the invention will become apparent by consideration of the detailed description and accompanying drawings.

BRIEF DESCRIPTION OF THE DRAWINGS

FIGS. 22A-C illustrate alternative locations for a control PCB on the brushless power tool of FIG. 15.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
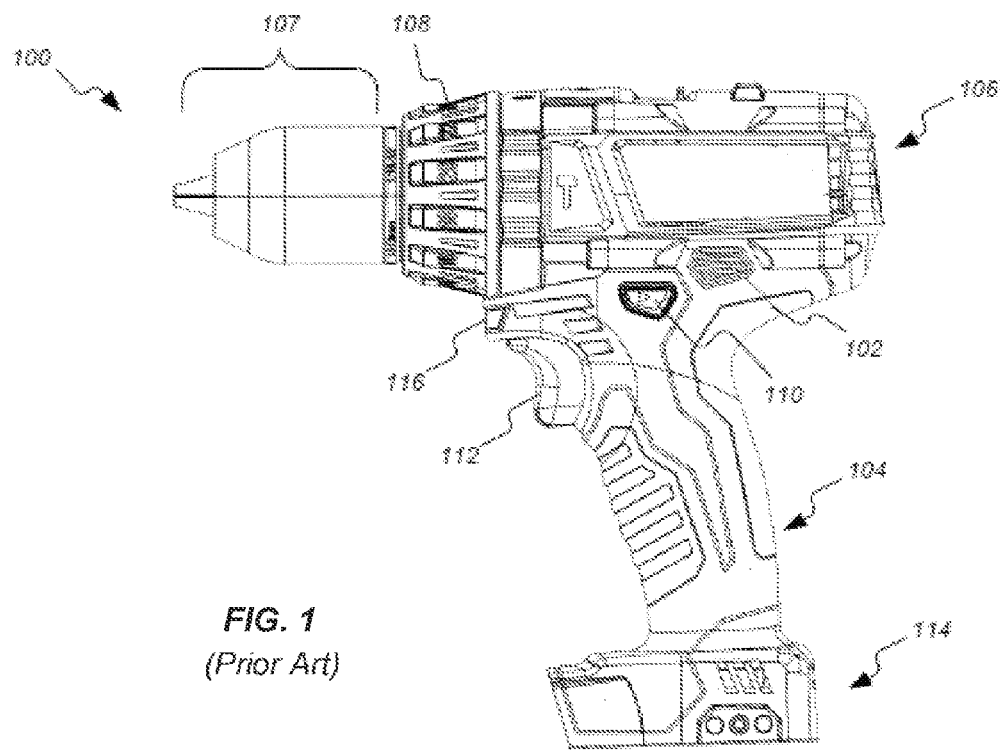
FIG. 1 illustrates a brushless power tool.
Figure 2:
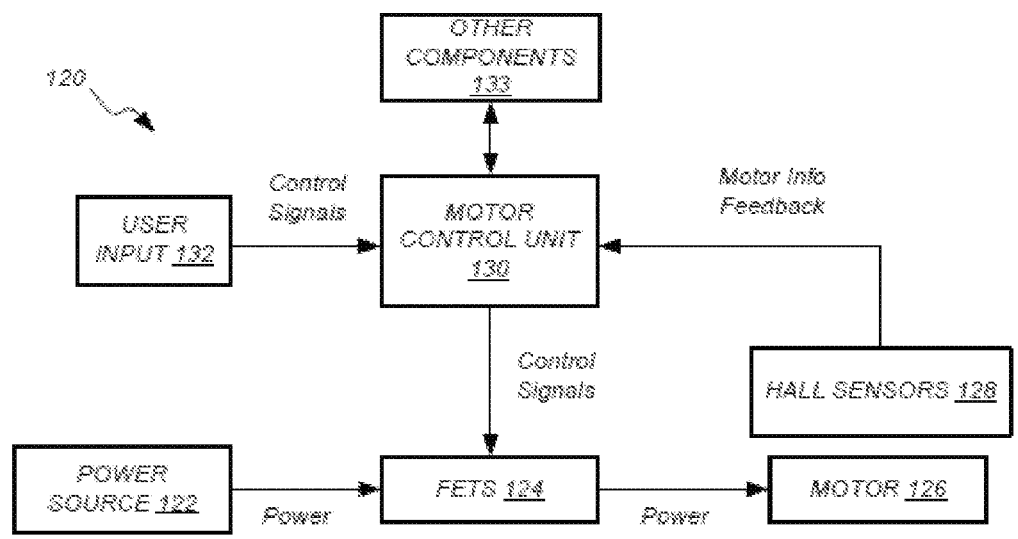
FIG. 2 illustrates a block diagram of a brushless power tool.
Figure 3A:
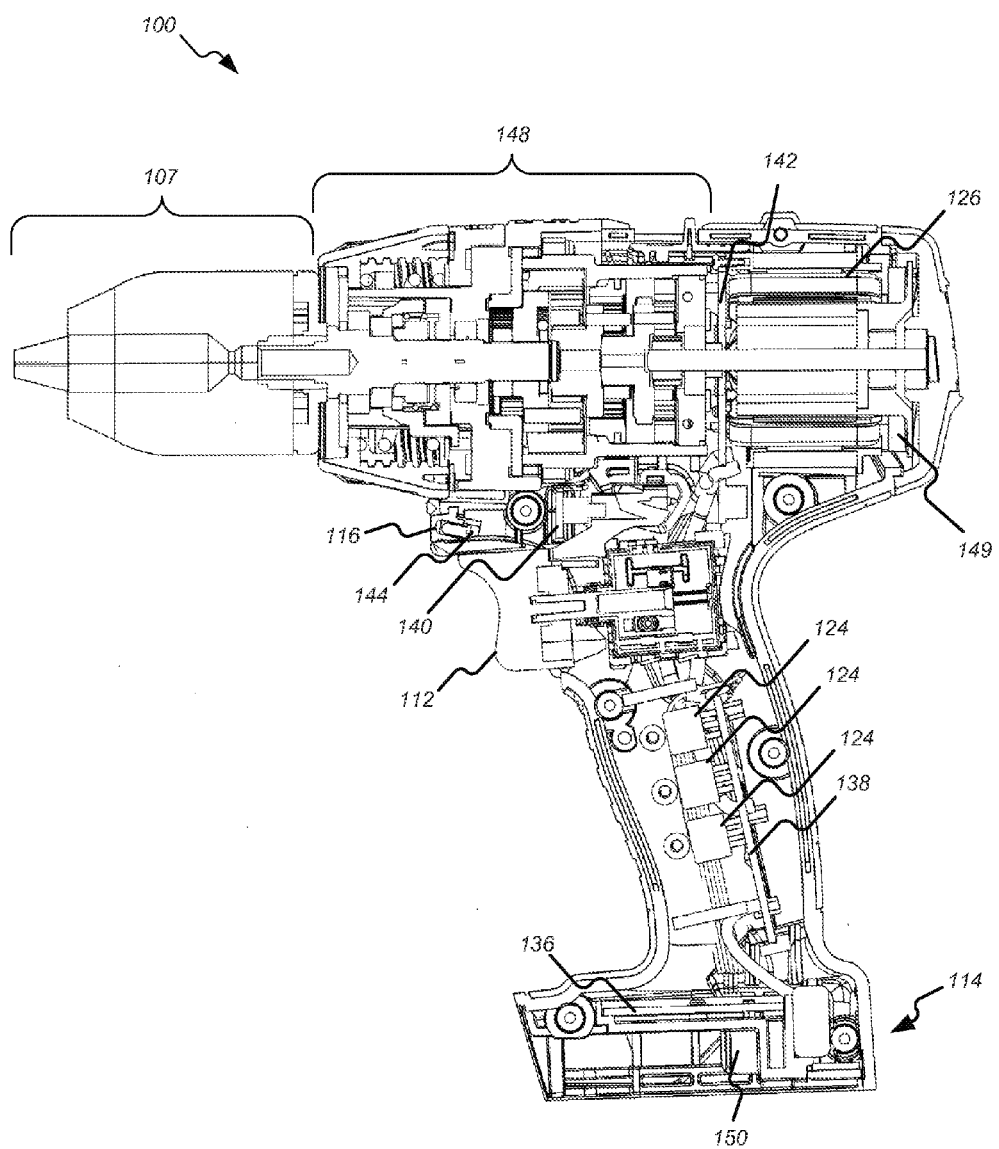
FIGS. 3A, 3B, and 4 provide additional view of the brushless power tool of FIG. 1.
Figure 3B:
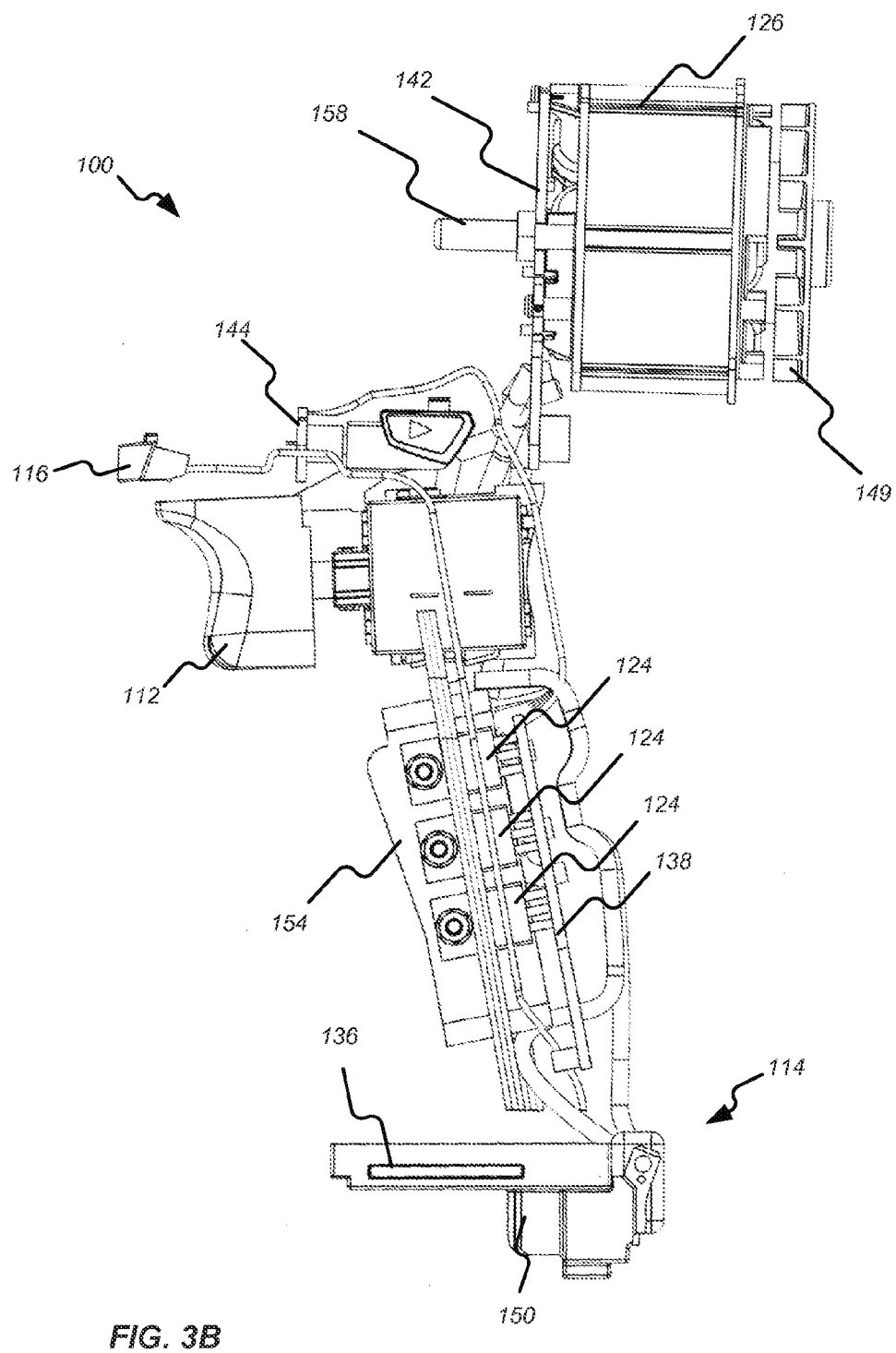

FIG. 3A illustrates a cross section of the brushless power tool 100 of FIG. 1, and FIG. 3B illustrates select components of the power tool 100. The power tool 100 includes separate printed circuit boards (PCBs) for various components of the power tool 100. More particularly, the power tool 100 includes a control printed circuit board (PCB) 136, a power PCB 138, a forward/reverse PCB 140, a Hall sensor PCB 142, and a light-emitting diode (LED) PCB 144. Also illustrated in FIG. 3A is a drive mechanism 148 for transmitting the rotational output of the motor 126 to the output unit 107, and a cooling fan 149 rotated by the motor 126 and used to provide a cooling air flow over components of the power tool 100.

Figure 4:
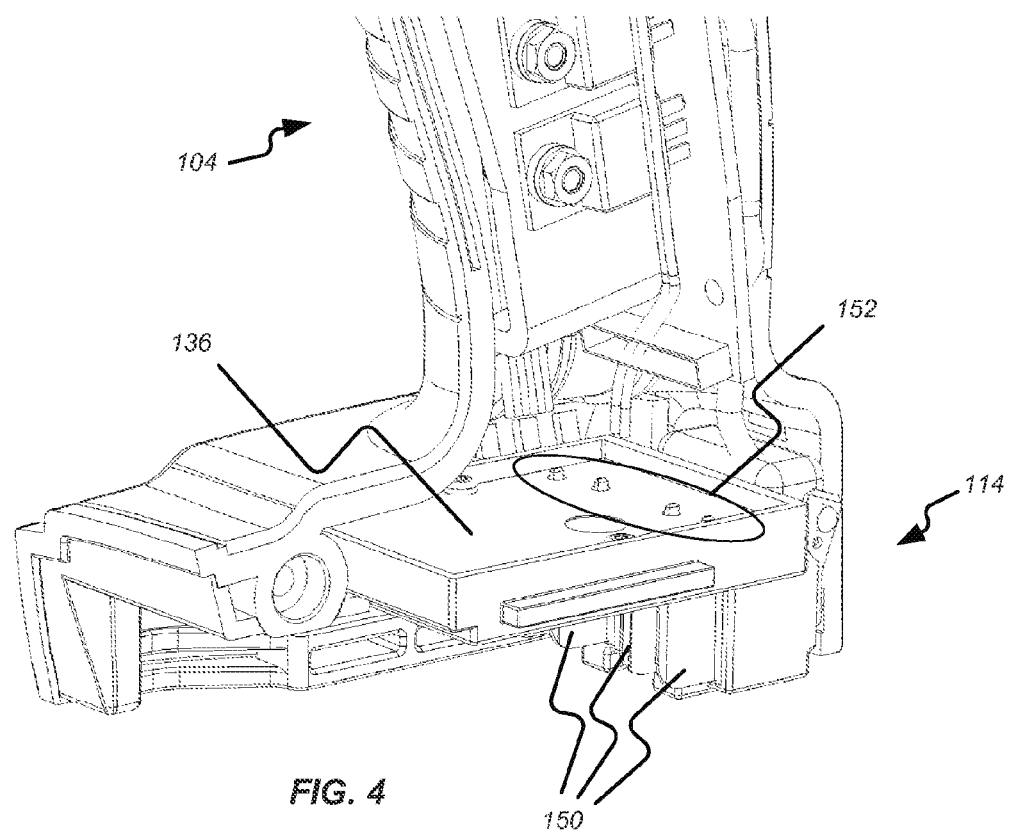

As shown in FIG. 4, the control PCB 136 is positioned at the base of the tool 100 between the handle portion 104 and the battery interface 114, which may also be referred to as a terminal block portion. The control PCB 136 includes the motor control unit 130, which is operable to receive user input, to receive motor information feedback, and to control the FETs 124 to drive the motor 126. The control PCB 136 is electrically and physically coupled to terminal blades 150. When a battery pack (i.e., the power source 122) is coupled to the battery interface 114, terminals of the battery pack are received by and electrically coupled to the terminal blades 150. The number of terminal blades can vary based on the type of hand-held power tool. However, as an illustrative example, terminal blades 150 can include a battery positive ("B+") terminal, a battery negative ("B−") terminal, a sense or communication terminal, and an identification terminal. As shown in FIG. 4, the terminal blades 150 have tabs 152 that extend upward through the control PCB 136. The tabs 152 may be directly soldered to the control PCB 136, eliminating the need for additional power wires. The motor control unit may use the communication terminal to communicate with a battery pack, allowing the battery pack to communicate whether it is capable of discharging to the power tool 100 and other information.

The power PCB 138 includes the FETs 124, which are connected to and controlled by the motor control unit 130 of the control PCB 136. As discussed above, the FETs 124 are also electrically coupled to the power source 122 and the motor 126. In some embodiments, the FETs 124 are directly coupled (i.e., directly physically and/or thermally coupled) to the heat sink 154 (e.g., directly on the heat sink, via copper tracings on the power PCB 138, etc.). In other embodiments, the FETs 124 are not directly coupled to the heat sink 154, but are in a heat transfer relationship with the heat sink 154.

The forward/reverse PCB 140 includes a forward/reverse switch that is operated by the forward/reverse selector 110, which has three positions: forward, reverse, and neutral. The positions may be shifted between by moving the forward/reverse selector/shuttle 110 in a direction normal to the plane of the drawing of FIG. 1 (i.e., in/out of the page). When the forward/reverse selector 110 is shifted between these three positions, the selector 110 switches the forward/reverse switch of the forward/reverse PCB 140, which provides a signal to the motor control unit 130. When the trigger 112 is depressed, the motor control unit 130 causes the motor 126 to rotate clockwise, rotate counterclockwise, or not rotate (e.g., in neutral) based on the position of the selector 110.

Figure 5:
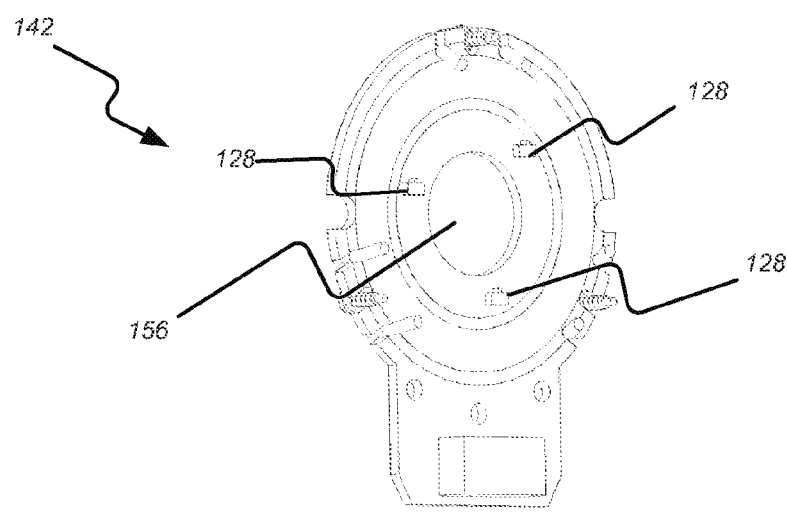
FIG. 5 illustrates a Hall sensor board.

The Hall sensor PCB 142 includes hall sensors 128 to detect one or more of the rotational position, velocity, and acceleration of the motor 126. The Hall sensor PCB 142 is electrically coupled to the control PCB 136 to provide the outputs of the Hall sensors 128. As shown in FIGS. 3B and 5, the Hall sensor PCB 142 includes a through-hole 156 through which a motor shaft/spindle 158 passes. Each Hall sensor 128 outputs a pulse when magnet of the rotor rotates across the face of that Hall sensor 128. Based on the timing of the pulses from the Hall sensors 128, the motor control unit 130 can determine the position, velocity, and acceleration of the rotor. The motor control unit 130, in turn, uses the motor feedback information to control the FETs 124.

The light-emitting element (LED) PCB 144 includes the light 116, which may be a light emitting diode (LED). The LED PCB 144 is electrically coupled to the control PCB 136 such that the motor control unit 130 is operable to selectively enable and disable the light 116. The motor control unit 130 may enable the light 116 when the trigger 112 is depressed and/or when a separate light switch on the housing 102 is activated by the user to selectively enable/disable the light 116 independent of the trigger 112. The motor control unit 130 may further include a delay timer such that the light 116 remains illuminated for a period of time after the trigger 112 or light switch is depressed or released.

The motor control unit 130 is implemented by the control PCB 136, which includes motor control unit 130 includes combinations of hardware and software that control operation of the power tool 100. For example, the control PCB 136 includes, among other things, a processing unit (e.g., a microprocessor, a microcontroller, or another suitable programmable device), a memory, input units, and output units. The processing unit includes, among other things, a control unit, an arithmetic logic unit ("ALU"), and a plurality of registers, and is implemented using a known computer architecture, such as a modified Harvard architecture, a von Neumann architecture, etc. The processing unit, the memory, the input units, and the output units, as well as the various modules connected to or part of the control PCB 136 are connected by one or more control and/or data buses. In some embodiments, the control PCB 136 is implemented partially or entirely on a semiconductor (e.g., a field-programmable gate array ["FPGA"] semiconductor) chip, such as a chip developed through a register transfer level ("RTL") design process.

The memory of the control PCB 136 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit is connected to the memory and executes software instructions that are capable of being stored in a RAM of the memory (e.g., during execution), a ROM of the memory (e.g., on a generally permanent basis), or another non-transitory computer readable medium such as another memory or a disc. Software included in the implementation of the battery pack can be stored in the memory of the controller. The software includes, for example, firmware, one or more applications, program data, filters, rules, one or more program modules, and other executable instructions. The processing unit is configured to retrieve from memory and execute, among other things, instructions related to the control of the battery pack described herein. The processing unit can also store various battery pack parameters and characteristics (including battery pack nominal voltage, chemistry, battery cell characteristics, maximum allowed discharge current, maximum allowed temperature, etc.). In other constructions, the control PCB 136 includes additional, fewer, or different components.

The motor control unit 130 may further be in communication with one or more sensors to monitor temperature, voltage, current, etc., of the power tool 100 and an attached battery pack. The motor control unit 130 may also include protection capabilities based on a variety of preset or calculated fault condition values related to temperatures, currents, voltages, etc., associated with the operation of the hand-held power tool.

The various interconnections of the power tool 100 between the control PCB 136, the power PCB 138, the forward/reverse PCB 140, the Hall sensor PCB 142, and the light-emitting element (LED) PCB 144 can lead to a complex and space-consuming wiring layout within the housing 102.

Figure 6:
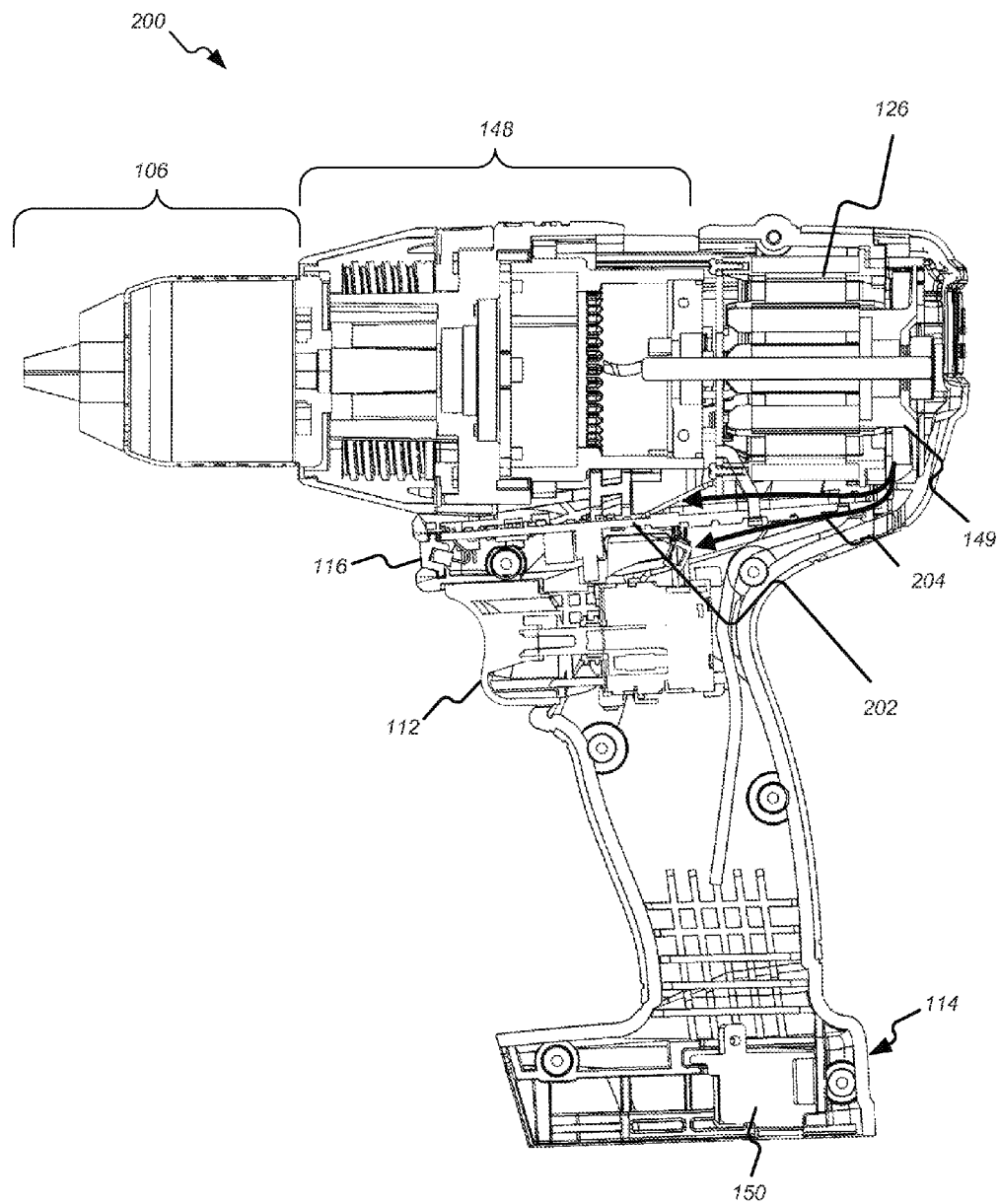
FIGS. 6-7 illustrate a brushless power tool having a combined surfboard PCB.
Figure 7:
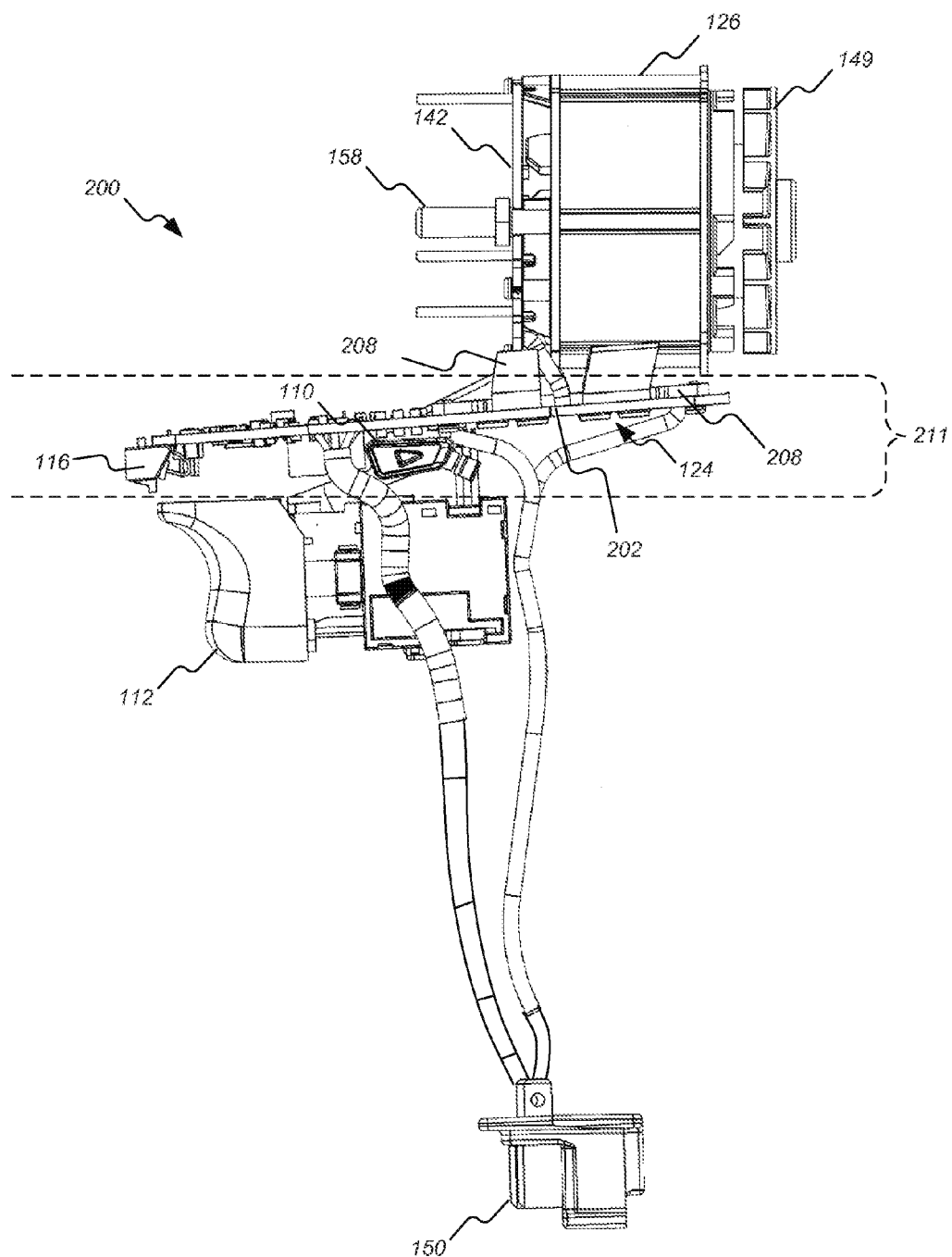

FIGS. 6-7 illustrate a brushless power tool 200, which has similarities to power tool 100, but has a different electronics layout. The layout of power tool 200 has reduced wiring and assembly complexity relative to the power tool 100. Additionally, the more compact and efficient layout of the power tool 200 enables additional flexibility in design, such as by allowing different handle and body dimensions and shapes. Elements of the power tool 200 similar to those of the power tool 100 are similarly numbered to simplify the description thereof.

Rather than a separate control PCB 136, power PCB 138, forward/reverse PCB 140, and LED PCB 144, the power tool 200 includes a combined surfboard PCB 202 incorporating the functionality of each. The combined surfboard PCB 202 includes the FETs 124 of the power PCB 138, the light 116 of the LED PCB 144, the motor control unit 130 of the control PCB 136, and a forward/reverse switch 203 of the forward/reverse PCB 140 (see FIG. 8C). Accordingly, in place of wires running through the housing 102 to interconnect the various PCBs, the connections are made via conductors on the combined surfboard PCB 202.

As illustrated, the combined surfboard PCB 202 has an elongated shape, with a length more than twice its width. The combined surfboard PCB 202 has a rear portion adjacent to the motor 126 and a front portion adjacent to a trigger 112. The Hall sensor PCB 142 is positioned above and generally perpendicularly (i.e., within 15 degrees of a perpendicular) to the combined surfboard PCB 202).

Moreover, the combined surfboard PCB 202 is positioned near the fan 149, such that cooling air flow 204 passes over the FETs 124 and other components of the combined surfboard PCB 202. The fan 149 operates to draw the cooling air flow 204 from the combined surfboard PCB 202 towards the fan 149, or, as illustrated, to push the cooling air flow 204 from the fan 149 over the combined surfboard PCB 202. Furthermore, air inlets and outlets are formed on the housing 102 to provide an inlet and outlet path for the cooling air flow 204.

The components of the combined surfboard PCB 202 are exposed. In other words, the combined surfboard PCB 202 is not encapsulated or potted within the housing 102 and is not protected against fluid within the housing 102 from reaching the FETs 124 or motor control unit 130. Exposing the combined surfboard PCB 202 improves the thermal management of the components thereon. For example, the cooling air flow 204 is operable to reach and cool the FETs 124, enabling the FETs 124 to operate at higher current levels and the motor 126 to operate at higher power levels and generate higher torque for longer periods of time.

Figure 8A:
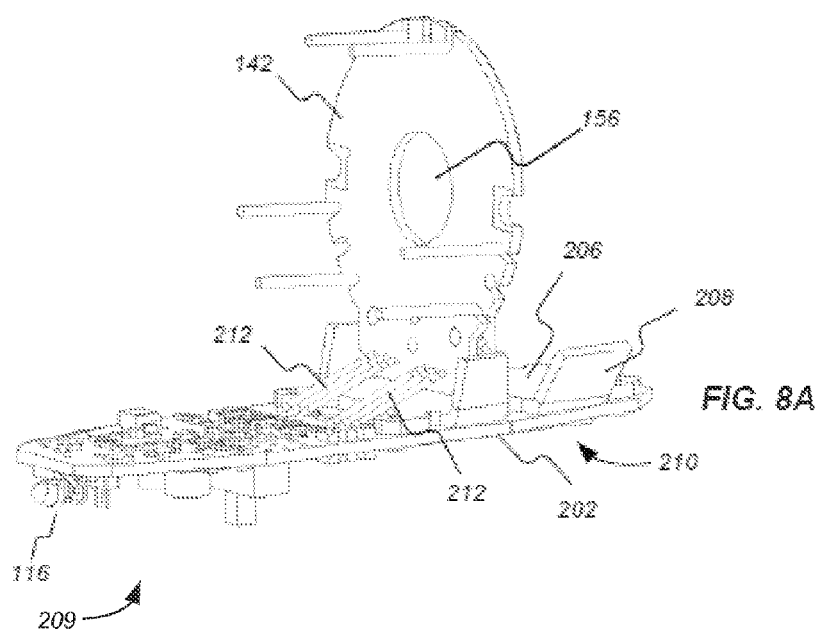
FIGS. 8A-C provide additional views of the combined surfboard PCB.
Figure 8B:
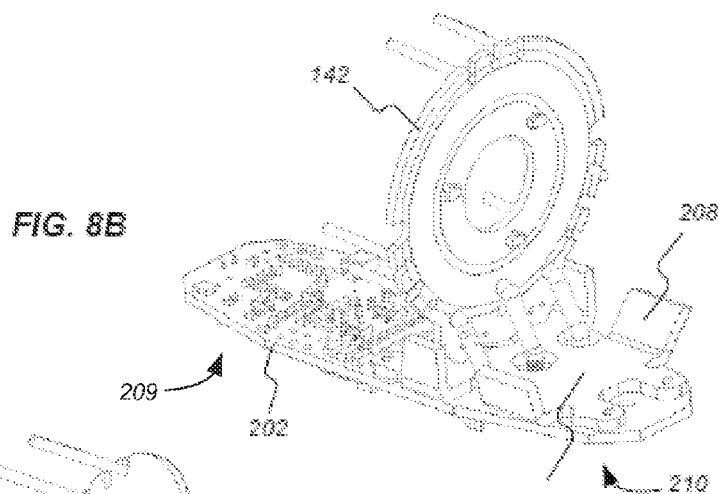
Figure 8C:
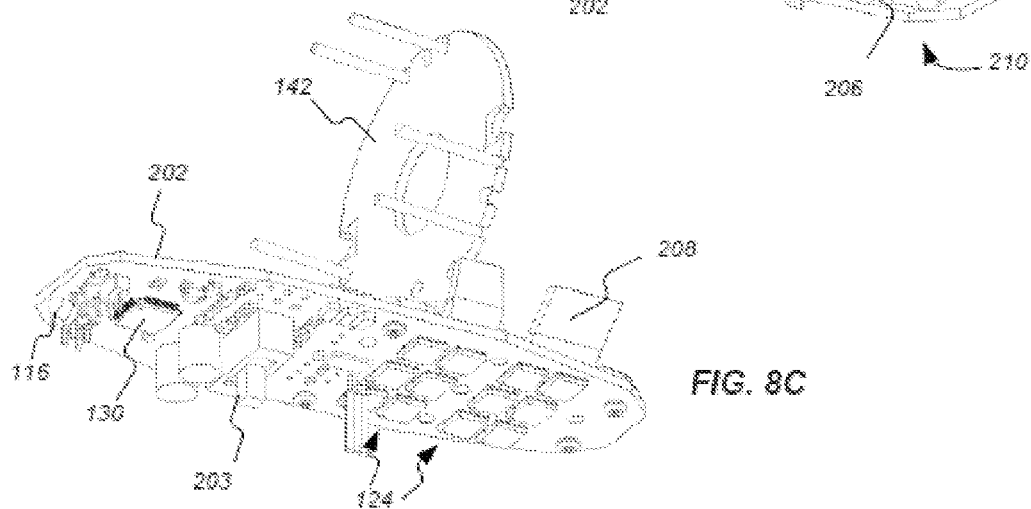

As shown in FIGS. 8A-C, the FETs 124 are mounted in a generally flat orientation on the combined surfboard PCB 202. In contrast, the FETs 124 of the power tool 100 are mounted on the power PCB 138 in a perpendicular orientation. The combined surfboard PCB 202 also has mounted thereon a heat sink 206 on a side opposite of the FETs 124 to provide cooling of the FETs 124. The heat sink 206 is thermally coupled to the FETs 124 and includes heat sink fins 208 to improve the heat sinking capabilities of the heat sink 206. In some instances, one or more additional heat sinks are positioned on the same side as the FETs 124, such that the FETs 124 and the combined surfboard PCB 202 are located between the heat sink 206 and the one or more additional heat sinks. The one or more additional heat sinks are thermally coupled to the FETs 124 to provide additional thermal management. A front portion 209 of the bottom surface of the combined surfboard PCB 202 includes the light 116 and the forward/reverse switch 203 mounted thereon. The FETs 124 are mounted on a rear portion 210 of the bottom surface of the combined surfboard PCB 202. The heat sink 206 is mounted on the rear portion 210 of the top surface of the combined surfboard PCB 202. The Hall sensor PCB 142 is above the surfboard PCB 202 and, taken together, generally form an upside-down "T" shape.

Additionally, the combined surfboard PCB 202 is centrally located within the power tool 200 above the trigger 112, but below the motor 126 and drive mechanism 148. FIG. 7 illustrates a region 211 considered above the trigger 112 and below the motor 126. "Below the motor" does not require that the combined surfboard PCB 202 be directly below the motor 126, but, rather, below a line extending parallel to the bottom surface of the motor 126. Accordingly, a shortened combined surfboard PCB 202 that does not extend rearward in the tool 200 such that it is, in part, directly under the motor 126 as shown in FIG. 7 can still be considered "below the motor." Similarly, "above the trigger" does not require that the combined surfboard PCB 202 be directly above the trigger, but, rather, within the region 211.

The central location allows relatively short wire connections between several components of the power tool 200. Furthermore, the exposed, unencapsulated nature of the combined surfboard PCB 202 further enables more flexibility in connection points to components thereon. That is, wires can reach components of the combined surfboard PCB 202 generally directly, rather than through limited ingress/egress ports of an encapsulation housing, allowing shorter and more direct wire connections. More particularly, the combined surfboard PCB 202 is near the Hall sensor PCB 142, the light 116, the trigger 112, the forward/reverse switch 203, and terminals of the motor 126. For instance, FIG. 8A illustrates the short wires 212 connecting the Hall sensor PCB 142 and the combined surfboard PCB 202. The wires 212 may be flexible or rigid and are connected generally at a middle portion of the combined surfboard PCB 202. Additionally, as shown, the wires 212 have a length less than a diameter of the motor 126, less than one-fourth of the length of the combined surfboard PCB 202, and less than a diameter of the Hall sensor PCB 142. Although a top surface of the combined surfboard PCB 202 is substantially parallel to the longitudinal axis of the motor shaft 158, the combined surfboard PCB 202 is angled slightly downward with respect to the motor shaft 158 from the motor side to the output side of the power tool 200. As illustrated in FIG. 6-7, the combined surfboard PCB 202 has a slight downward angle of less than 5 degrees with respect to the motor shaft 158.

In some embodiments, the forward/reverse selector 110 includes a magnet mounted therein and the combined surfboard PCB 202 includes a forward/reverse Hall sensor (not shown) in place of the forward/reverse switch 203. The forward/reverse Hall sensor detects movement of the embedded magnet when the forward/reverse selector 110 is moved, and a signal indicating the position or movement of the forward/reverse selector 110 is provided to the motor control unit 130.

The combined surfboard PCB 202 includes an exemplary component layout. In some embodiments, various components, such as one or more of the FETs 124, are mounted on a different portion of the combined surfboard PCB 202 (e.g., top instead of bottom surface, front instead of rear portion, etc.).

In some embodiments, the power tool 200 is a (non-hammer) drill/driver power tool that includes a similar electronics layout, housing, motor, etc., but includes a different drive mechanism 148 having no hammer mechanism.

Figure 9:
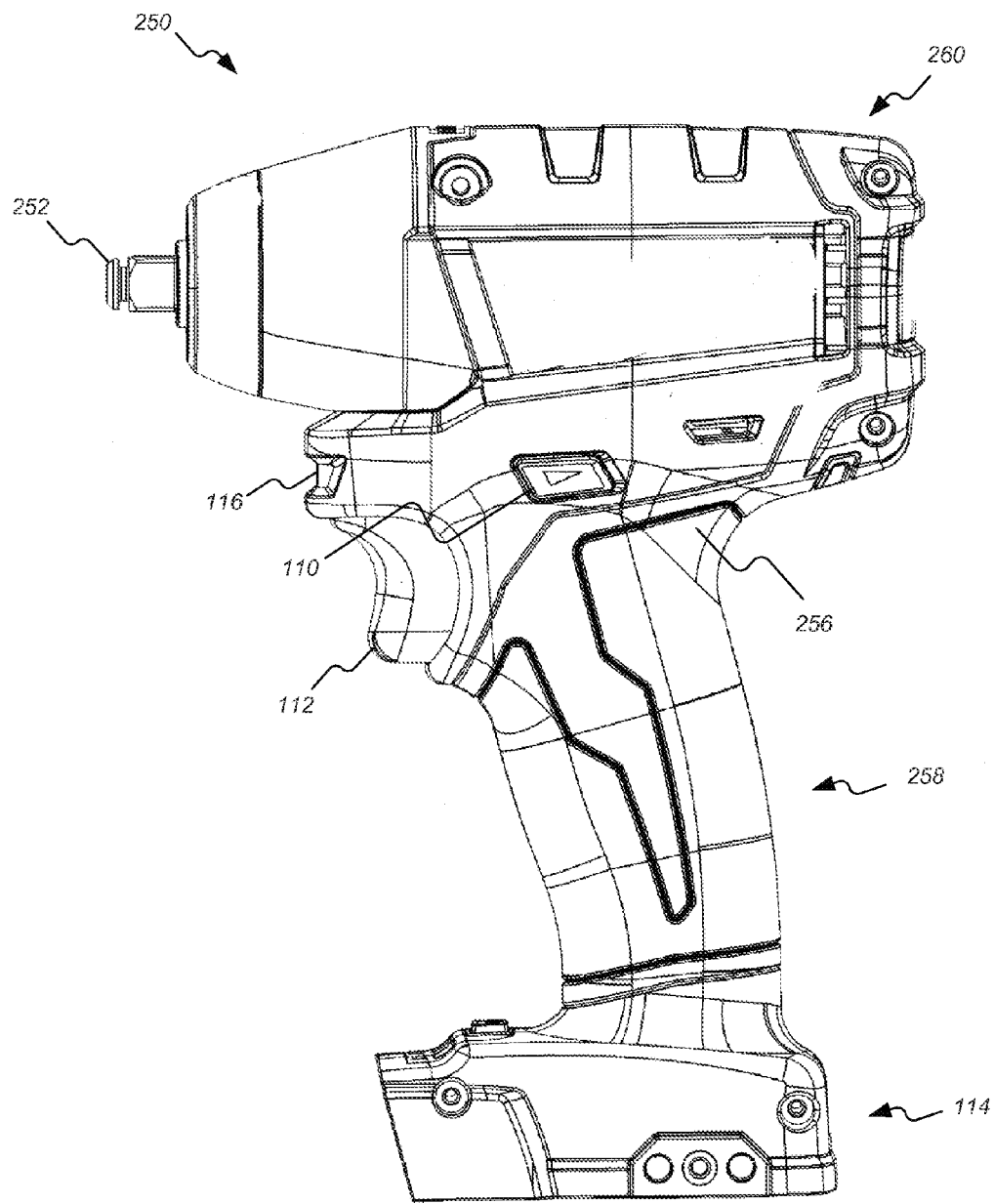
FIGS. 9-11 illustrate another brushless power tool having a combined surfboard PCB.
Figure 10:
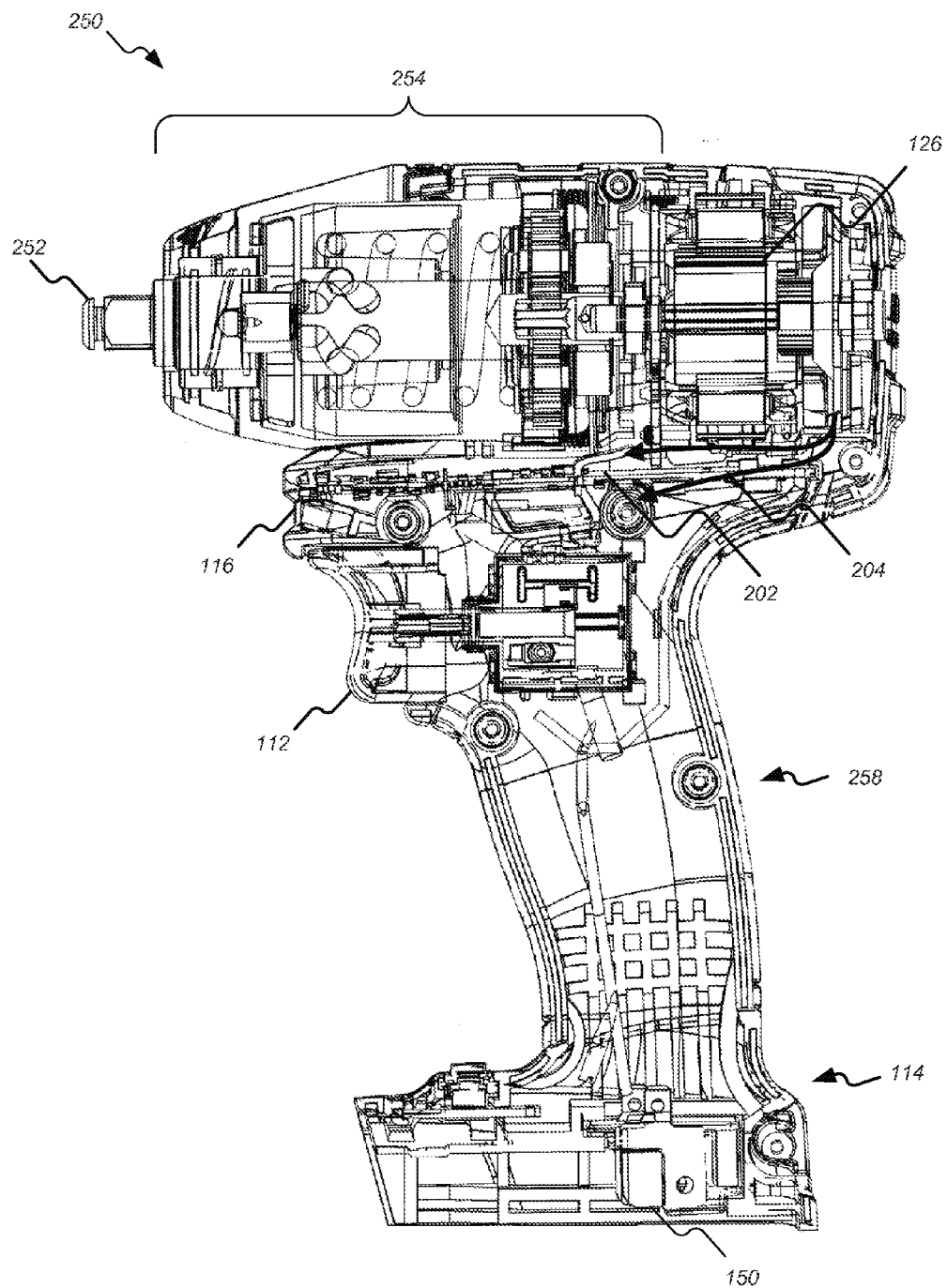
Figure 11:
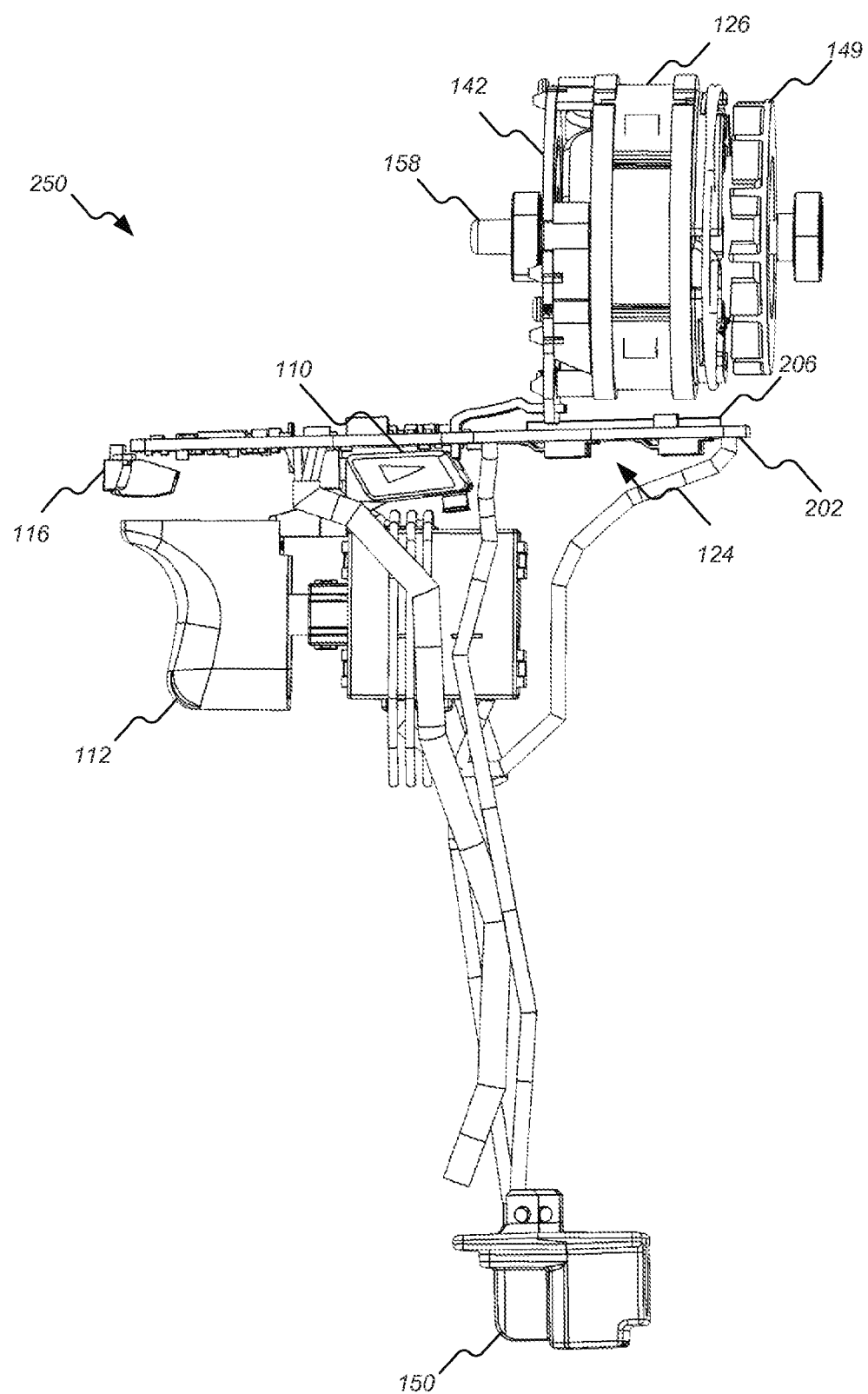

FIGS. 9-11 illustrate a brushless impact wrench power tool 250 including an impact output unit 252. The impact wrench is another type of hand-held power tool used for generating rotational output, but includes an impact mechanism 254 that differs from the hammer-style drive mechanism 148 of the power tools 100 and 200.

The power tool 250 includes a similar layout as the power tool 200. More particularly, the power tool 250 includes a housing 256 with a handle portion 258 and motor housing portion 260. The motor housing portion 260 houses a motor 126 and is positioned above the handle portion 258. The handle portion 258 includes the battery interface 114 for coupling to a battery pack. Additionally, the power tool 250 includes the combined surfboard PCB 202 and Hall sensor PCB 142. The layout of power tool 250 has reduced wiring and assembly complexity relative to the power tool 100. Additionally, the more compact and efficient layout of the power tool 250 enables additional flexibility in design, such as by allowing different handle and body dimensions and shapes. Elements of the power tool 250 similar to those of the power tools 100 and 250 are similarly numbered to simplify the description thereof.

Figure 12:
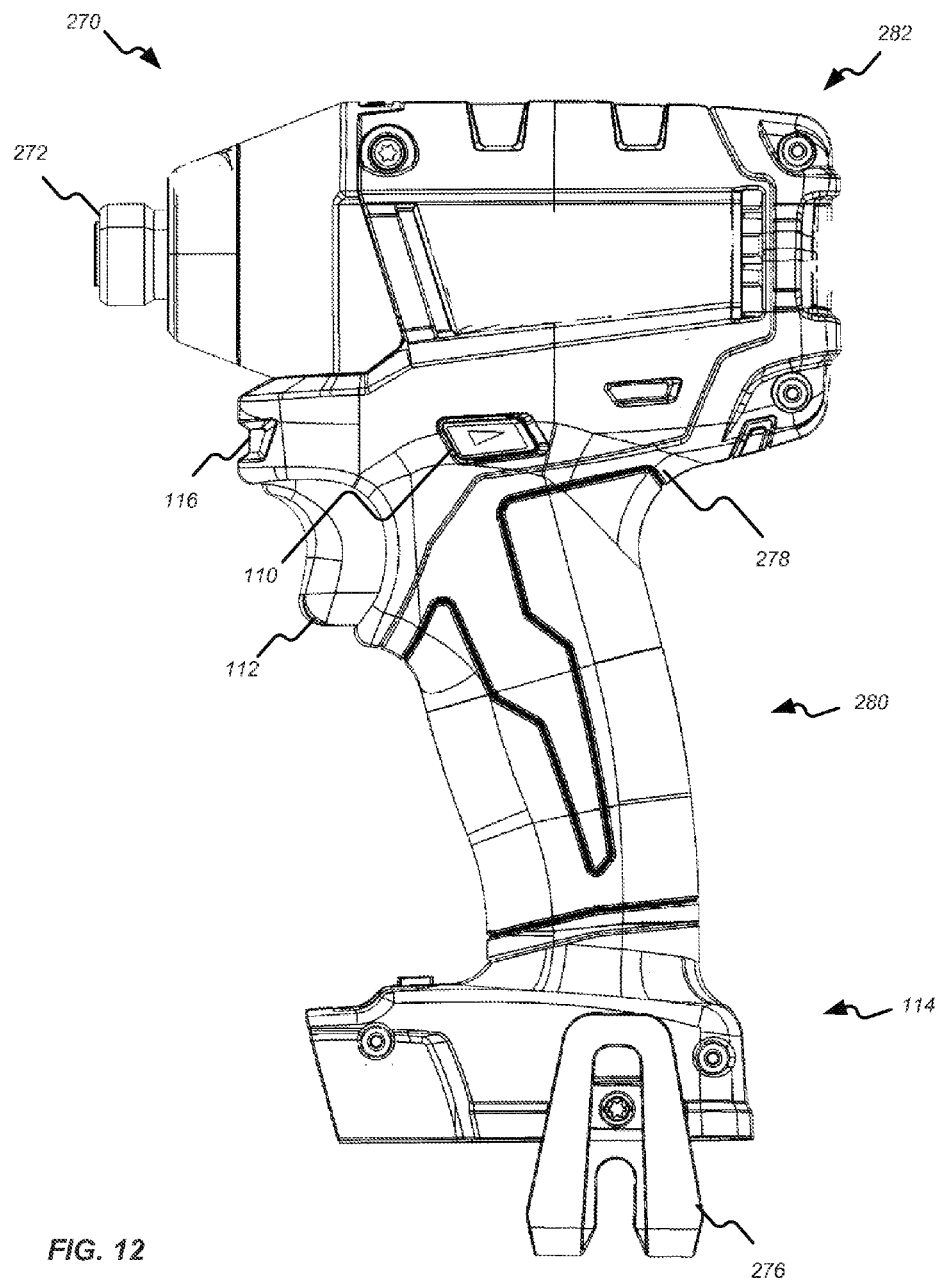
FIGS. 12-14 illustrate another brushless power tool having a combined surfboard PCB.
Figure 13:
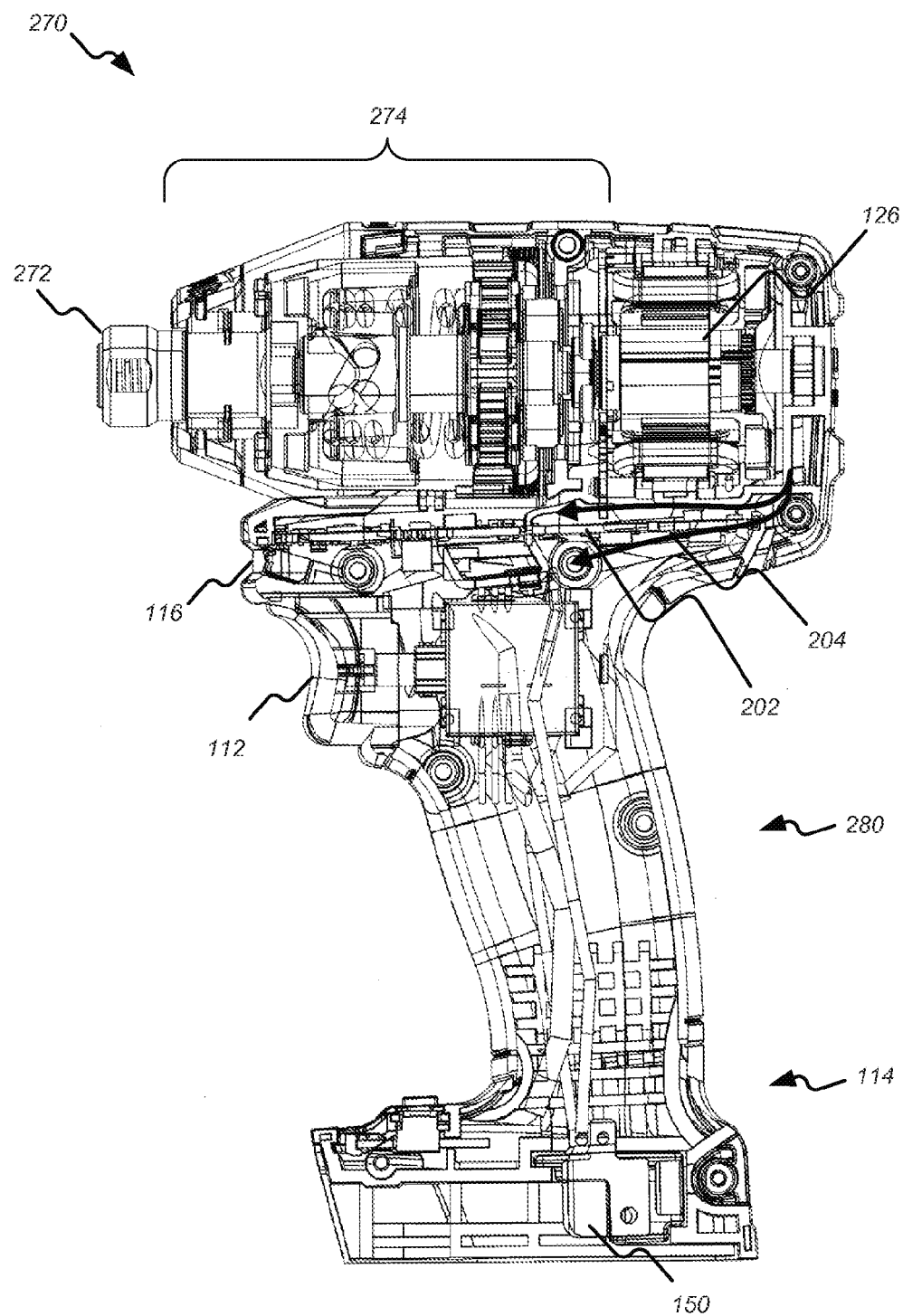
Figure 14:
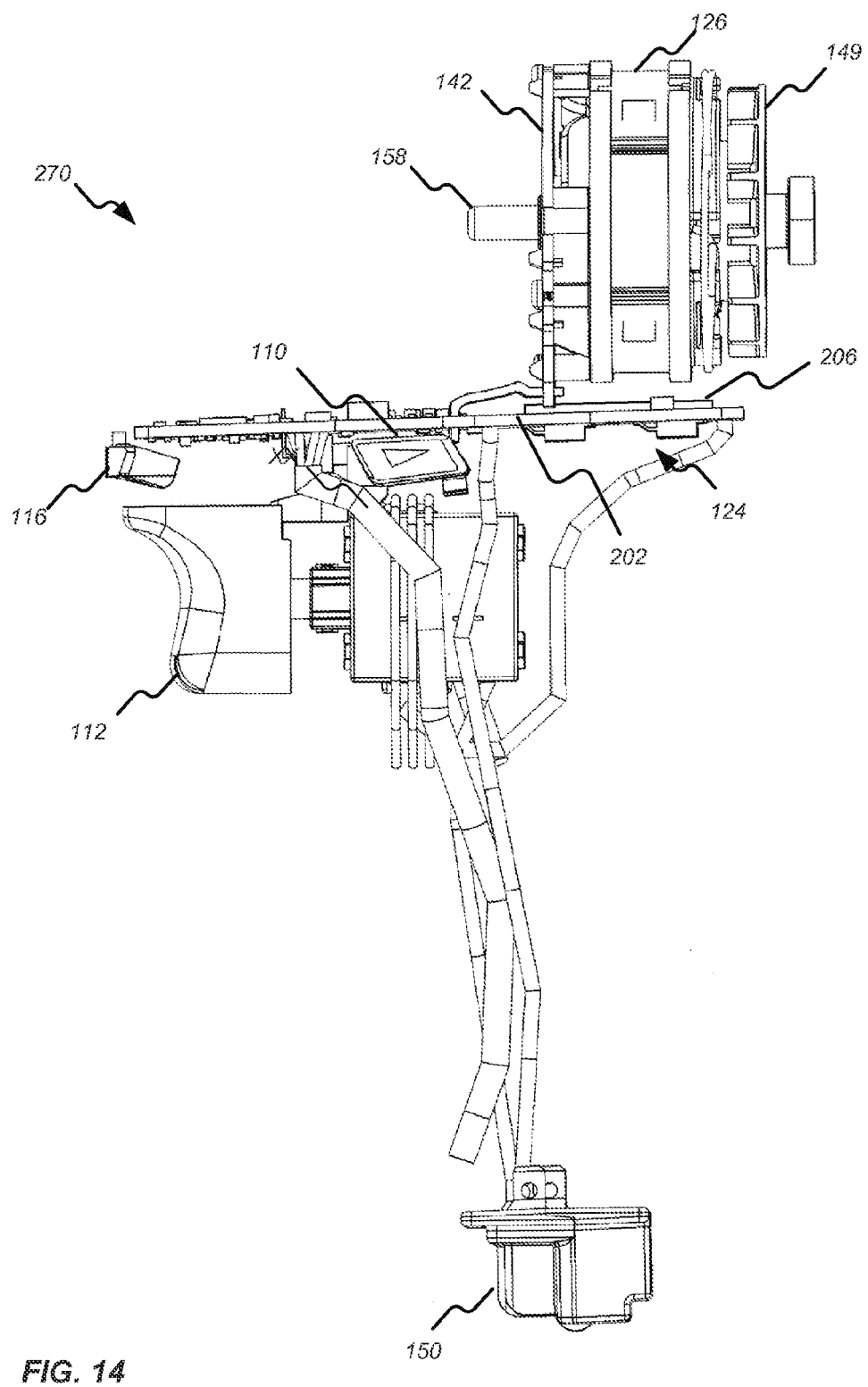

FIGS. 12-14 illustrate a brushless impact driver power tool 270 including an impact output unit 272. The impact driver power tool 270 is another type of hand-held power tool used for generating rotational output that includes an impact mechanism 274 similar to the impact mechanism 254. Additionally, the power tool 270 includes a clip 276 for hanging the power tool 270 on various items, such as on a hook or tool belt.

The power tool 270 includes a similar layout as the power tools 200 and 250. More particularly, the power tool 270 includes a housing 278 with a handle portion 280 and motor housing portion 282. The motor portion 282 houses a motor 126 and is positioned above the handle portion 280. The handle portion 280 includes the battery interface 114 for coupling to a battery pack. Additionally, the power tool 270 includes the combined surfboard PCB 202 and Hall sensor PCB 142. The layout of power tool 270 has reduced wiring and assembly complexity relative to the power tool 100. Additionally, the more compact and efficient layout of the power tool 270 enables additional flexibility in design, such as by allowing different handle and body dimensions and shapes. Elements of the power tool 270 similar to those of the power tools 100 and 270 are similarly numbered to simplify the description thereof.

Although the physical layout of the combined surfboard PCB 202 may be generally similar for each of the power tools 200, 250, and 270, the particular software and hardware of the motor control unit 130 and ratings of electrical components and FETs 124 may vary and be optimized for each tool.

Figure 15:
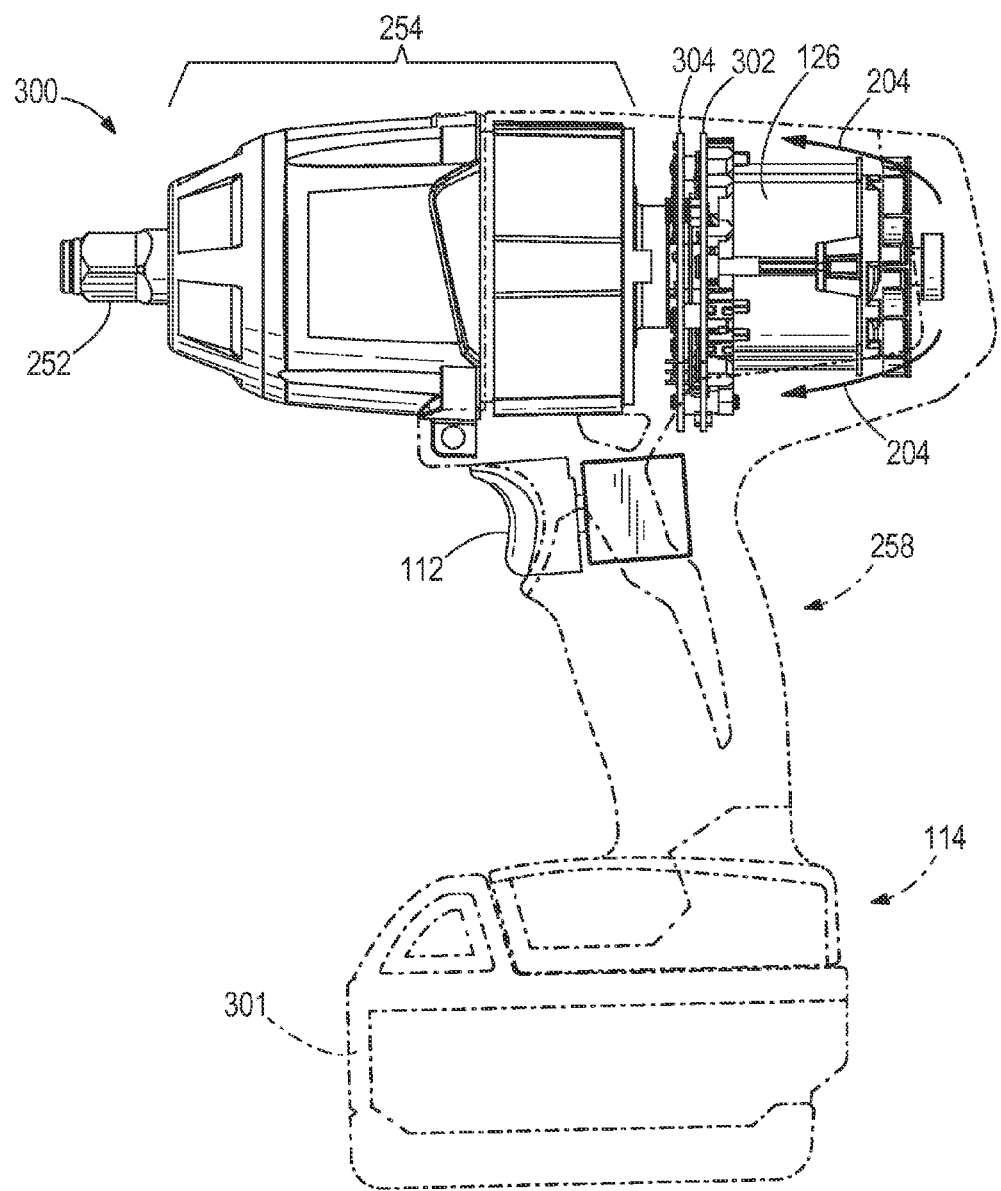
FIG. 15 illustrates a brushless power tool having a combined doughnut PCB.

FIG. 15 illustrates another brushless impact wrench power tool 300 including the impact output unit 252 and impact mechanism 254, and having a battery pack 301 attached to the battery interface 114. Elements of the power tool 300 similar to the previously described power tools are similarly numbered to simplify the description thereof.

The layout of power tool 300, like that of the power tools 200, 250, and 270, has reduced wiring complexity and reduced costs relative to the power tool 100. However, the power tool 300 has a different PCB layout in that the combined surfboard PCB 202 is not included. Rather, the components of the combined surfboard PCB 202 are positioned on (generally) doughnut-shaped PCBs near the motor. Separate PCBs similar to the LED PCB 144 and forward/reverse PCB 140 may be provided in the power tool 300 for inclusion and support of the light 116 and switch 203, respectively.

Figure 16A:
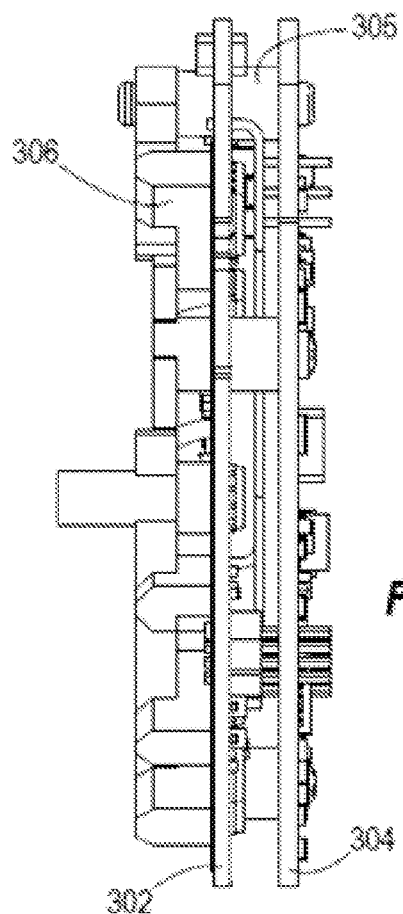
FIGS. 16A-B show the combined doughnut PCB of the power tool of FIG. 15.
Figure 16B:
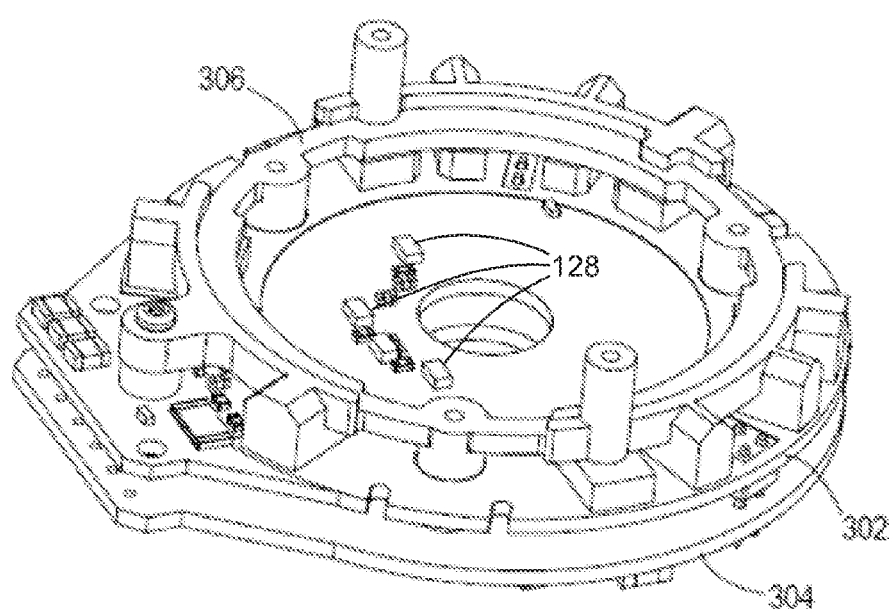

More specifically, as shown in FIGS. 16A-B, the power tool 300 includes a Hall and FET PCB 302 and a control PCB 304 stacked on the motor 126 and having a hole through which the motor shaft 158 passes. The Hall and FET PCB 302 is kept separated from the control PCB 304 by spacers 305. The Hall and FET PCB 302 includes the Hall sensors 128 and the FETs 124, while the control PCB 304 includes the motor control unit 130. Additionally, a heat sink 306, also with a generally doughnut or ring shape, is secured between the Hall and FET PCB 302 and the motor 126. The heat sink 306 is generally used to transfer heat away from the FETs 124.

Figure 17A:
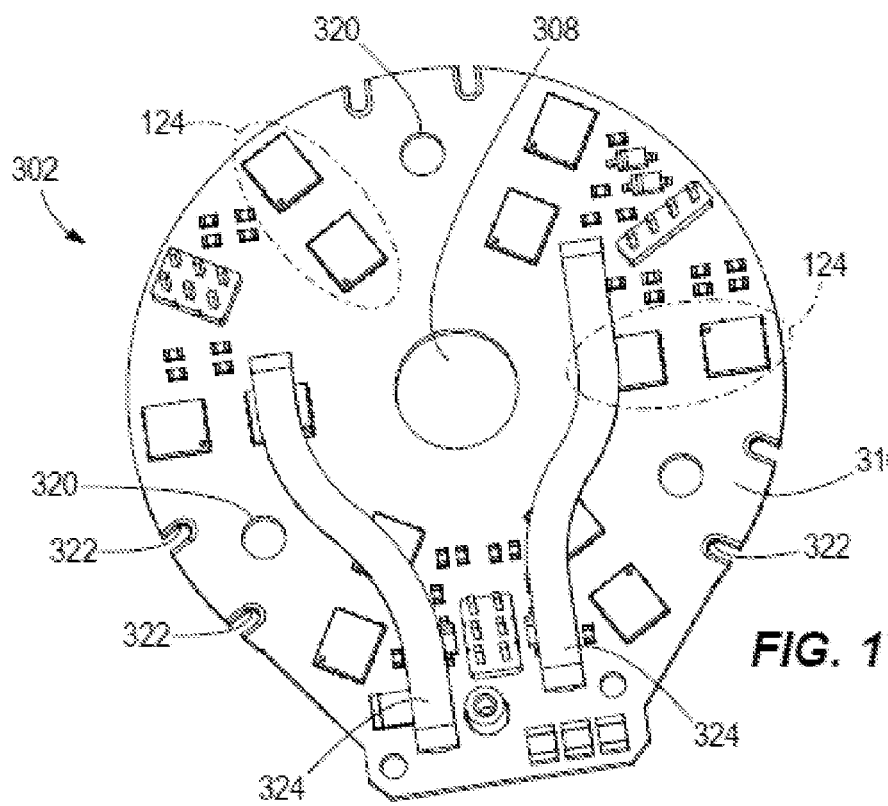
FIGS. 17A-B show a combined Hall and FET PCB of the power tool of FIG. 15.
Figure 17B:
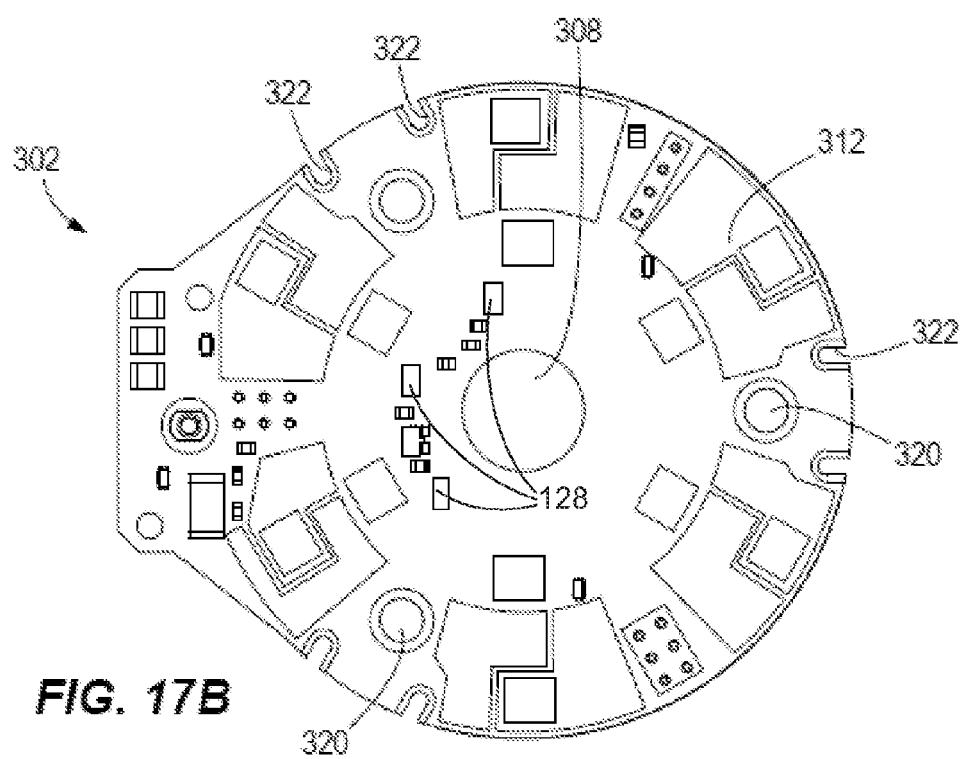
Figure 18A:
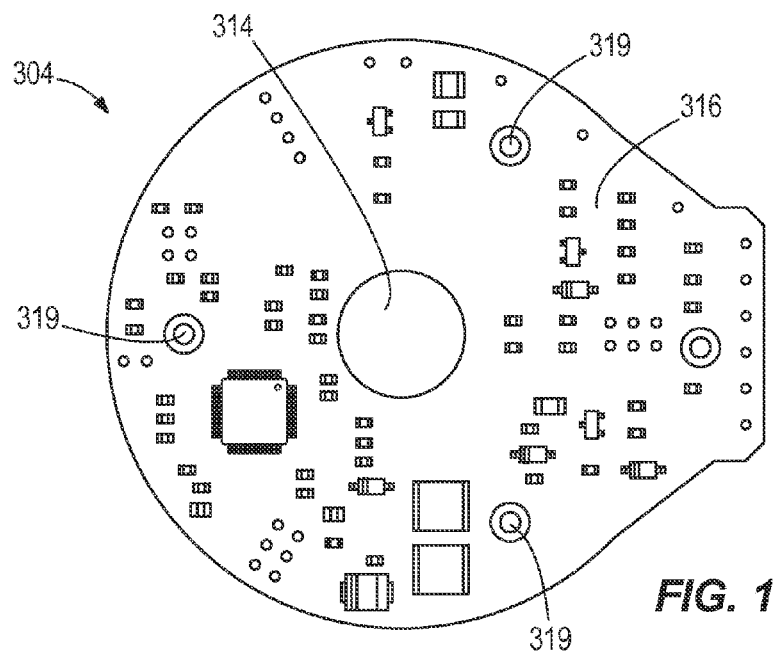
FIGS. 18A-B show a combined control PCB of the PCB stack.
Figure 18B:
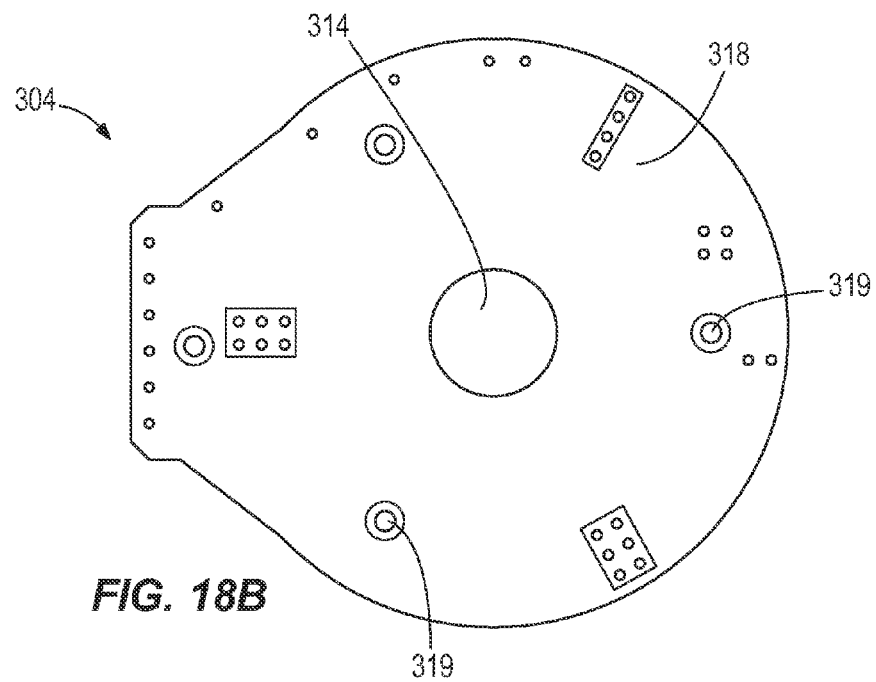

FIGS. 17A-B illustrate the Hall and FET PCB 302 in greater detail. The Hall and FET PCB 302 has a generally circular shape with a through-hole 308 in the center. A motor shaft 158, as well as a motor bushing 309 (see, e.g., FIG. 21), pass through the through-hole 308. The Hall and FET PCB 302 has two generally flat mounting surfaces: a first face 310 (see FIG. 17A) and a second face 312 (see FIG. 17B). The FETs 124 are mounted on the Hall and FET PCB 302 in a flat orientation. Similarly, the control PCB 304 has a through-hole 314 and two generally flat mounting surfaces: a first face 316 (see FIG. 18A) and a second face 318 (see FIG. 18B). The control PCB 304 further includes control PCB mounting holes 319. The control PCB 304 and Hall and FET PCB 302 are located coaxially about the motor shaft 158 and the faces 310, 312, 316, and 318 are generally parallel to each other. The PCBs 302 and 304 are secured to an end of the motor 126. By locating FETs 124 with Hall sensors 128 on a single Hall and FET PCB 302 secured to the end of the motor 126, the Hall and FET PCB 302 is able to receive a large amount of air flow 204 for cooling in addition to reducing the internal wiring of the power tool 300.

The Hall and FET PCB 302 further includes Hall and FET PCB mounting holes 320, motor lead pads 322, and copper bus bars 324. The copper bus bars 324 allow for additional space on the Hall and FET PCB 302 to be used for other features such as high current traces. Accordingly, rather than occupying space on the Hall and FET PCB 302, the copper bus bars 324 jump above the Hall and FET PCB 302. In alternative embodiments, traces on the Hall and FET PCB 302 are used instead of the copper bus bars 324.

The Hall and FET PCB mounting holes 320 allow metal standoffs 305 (see FIG. 16A-B) of the heat sink 306 to pass through the Hall and FET PCB 302. The metal standoffs 305 provide spacing between the PCBs 302 and 304 and allow the control PCB 304 to be attached to the heat sink 306. The metal standoffs 305 receive control PCB mounting screws inserted through mounting holes 319 of the control PCB 304 to secure the control PCB 304 to the heat sink 306. In some embodiments, the control PCB mounting screws secure both the control PCB 304 and the Hall and FET PCB 302 to the heat sink 306.

Furthermore, in some embodiments, Hall and FET PCB mounting holes 320 may be used for both allowing metal standoffs 305 of the heat sink 306 to pass through the Hall and FET PCB 302 and for securing the Hall and FET PCB 302 to the heat sink 306. Tightly securing the Hall and FET PCB 302 to the heat sink 306 allows for heat to dissipate from the Hall and FET PCB 302 to the heat sink 306 more easily and minimizes vibration between the Hall and FET PCB 302 and the motor 126. In other embodiments of the invention, the number of mounting holes 319 and 320 and their location on the PCBs 302 and 304 are varied. Furthermore, in other embodiments, the general shape of the PCBs 302 and 304 is varied.

Figure 19A:
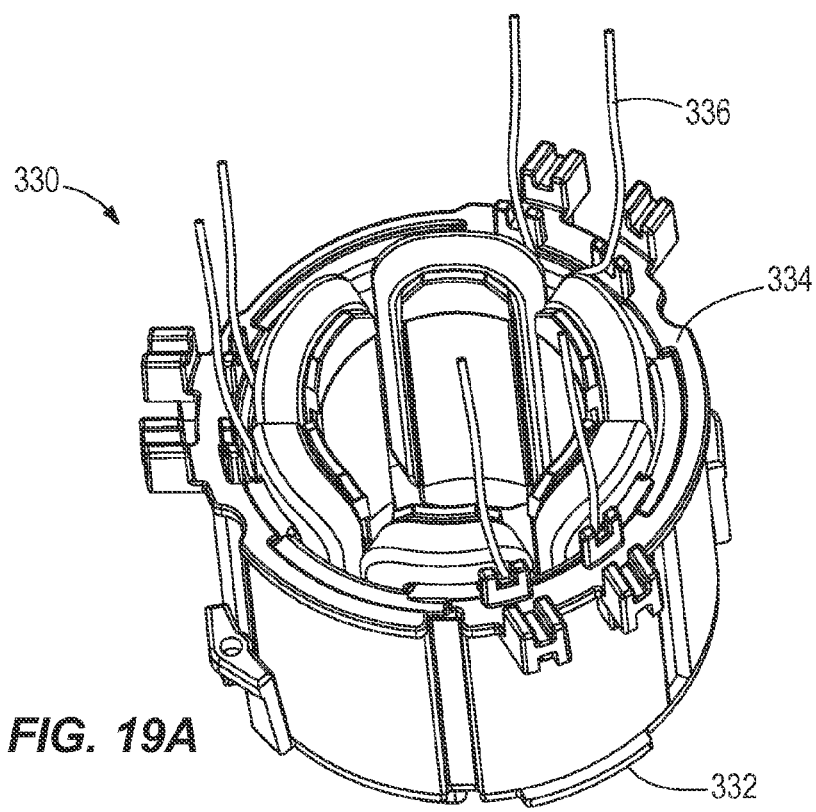
FIGS. 19A-G illustrate a process for attaching a Hall and FET PCB and heat sink to a brushless motor.
Figure 19B:
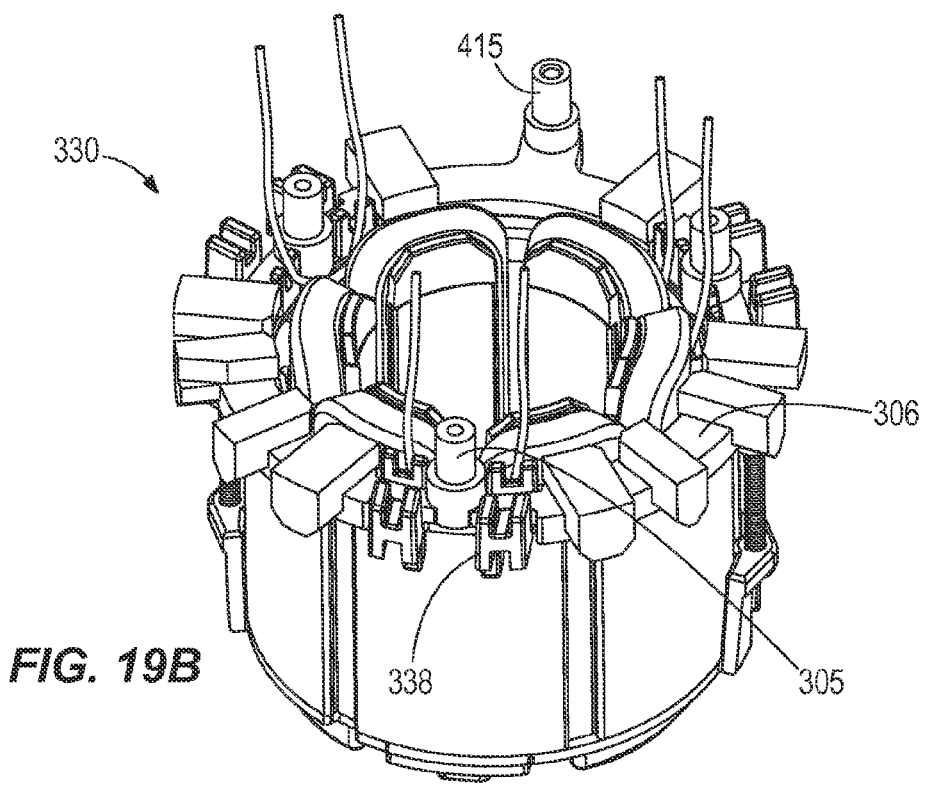

FIGS. 19A-G illustrate a process for attaching the motor 126, Hall and FET PCB 302, and heat sink 306 together. FIG. 19A illustrates a motor stator 330 of the motor 126 with plastic end caps 332 and 334 at each end of the motor stator 330, respectively, and six motor leads 336 that are stripped down to the plastic end cap 334. Wire support features 338 are part of the plastic end cap 334 and will be used to properly guide the motor leads 336, as explained below. FIG. 19B illustrates the heat sink 306 placed on the plastic end cap 334 of the motor stator 330. The metal standoffs 305 of the heat sink 306 may be used for mounting the control PCB 304 and/or locating the Hall and FET PCB 302 in some embodiments.

Figure 19C:
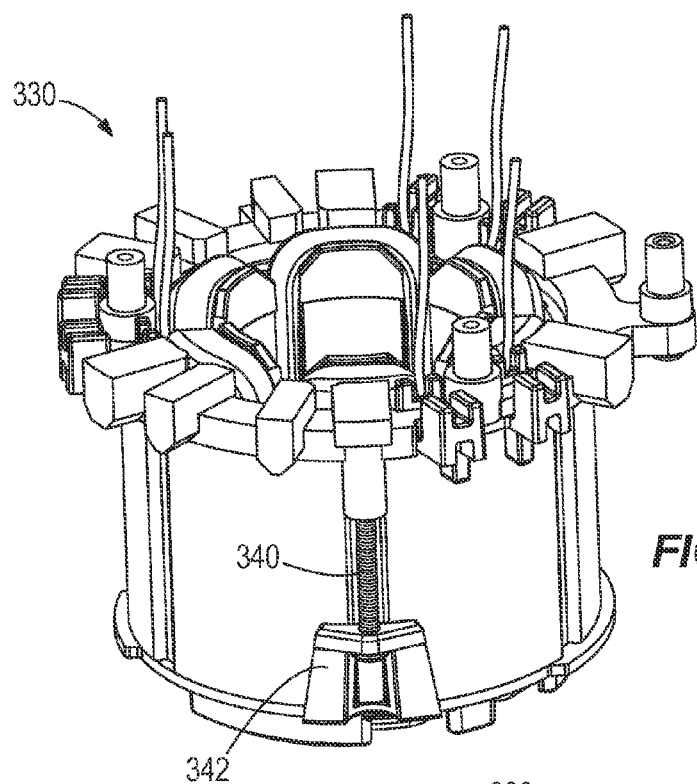

FIG. 19C illustrates the heat sink 306 fastened to the motor stator 330 using heat sink mounting screws 340. Heat sink mounting clips 342 are attached to an end of the motor stator 330 opposite the end where the heat sink 306 is attached. The heat sink mounting screws 340 are threadingly engaged with heat sink mounting standoffs of the heat sink 306 and the heat sink mounting clips 342 to secure the heat sink 306 to the motor stator 330. In some embodiments the number and location of heat sink mounting elements are varied.

Figure 19D:
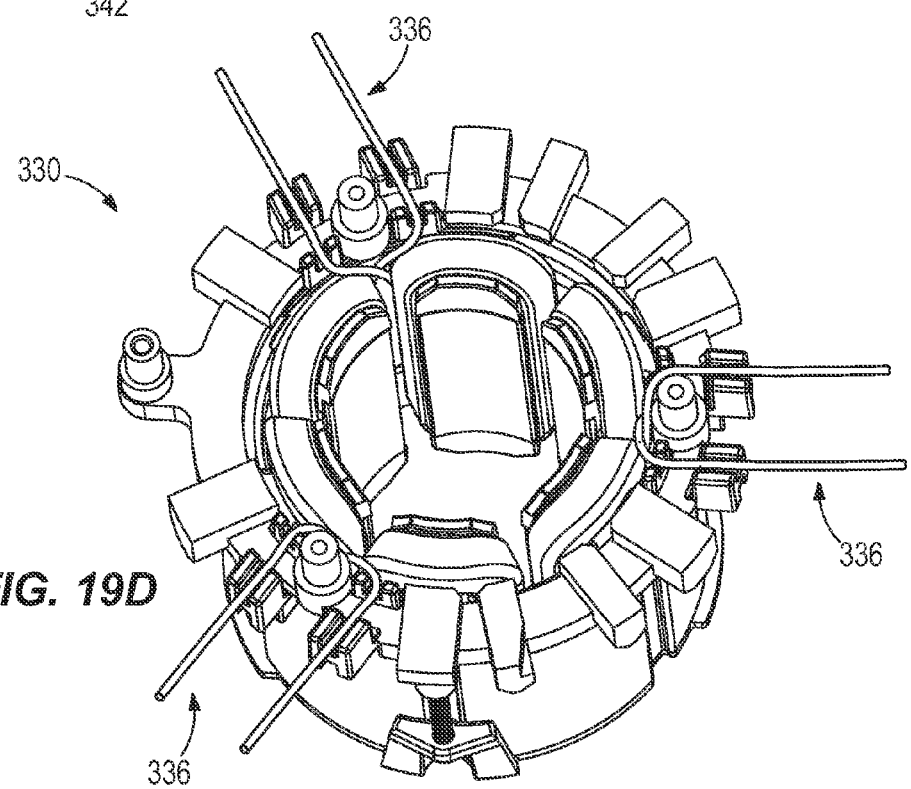

After securing the heat sink 306, the motor leads 336 are then bent downward to fit within the wire support features 338 as shown in FIG. 19D. Wrapping the motor leads 336 around the wire support features 338 relieves strain on the motor leads 336 before they are soldered to the Hall and FET PCB 302. In some embodiments, glue can also be applied to the motor leads 336 to secure them to the heat sink 306.

Figure 19E:
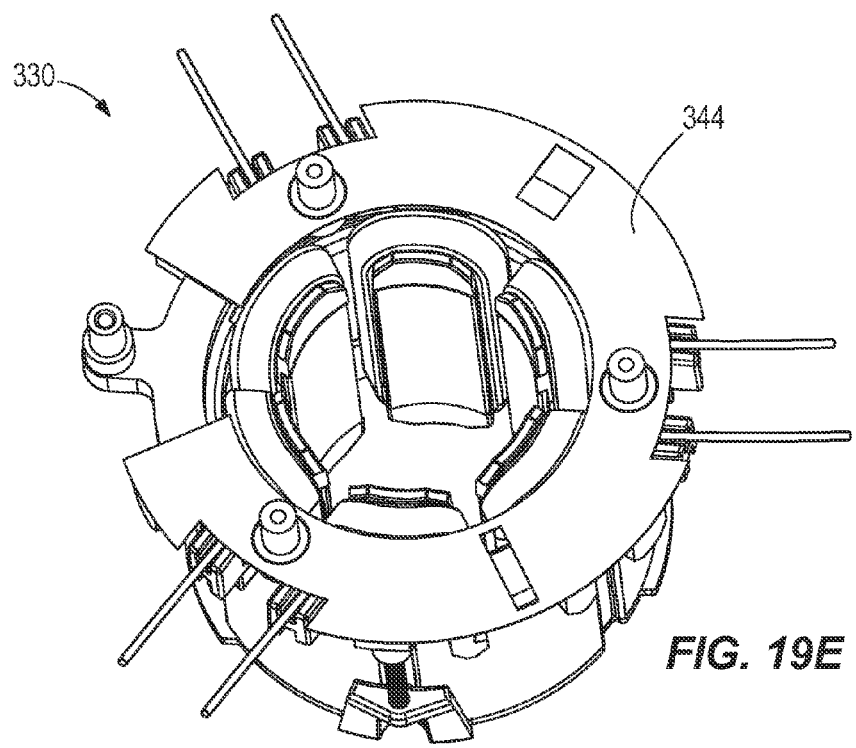

FIG. 19E illustrates a heat sink pad 344 placed on top of the heat sink 306. The heat sink pad 344 is a thin, electrical insulator with high thermal conductivity. These characteristics allow the heat sink pad 306 to electrically isolate the metal heat sink 306 from the Hall and FET PCB 302 while still allowing heat from the Hall and FET PCB 302 to dissipate via the heat sink 306.

Figure 19F:
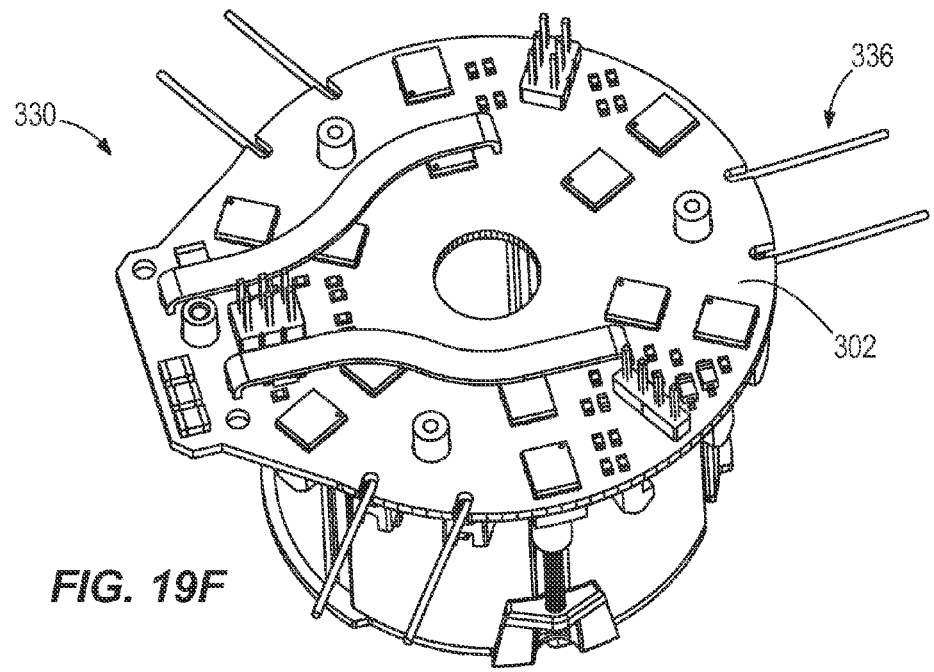

FIG. 19F illustrates the Hall and FET PCB 302 placed on top of the heat sink pad 344 and heat sink 306. The motor leads 336 align with the openings of the motor lead pads 322, and the metal standoffs 305 of the heat sink 306 pass through the Hall and FET PCB mounting holes 320. To ensure contact between the Hall and FET PCB 302 and the heat sink 306, downward force is applied to the Hall and FET PCB 302.

Figure 19G:
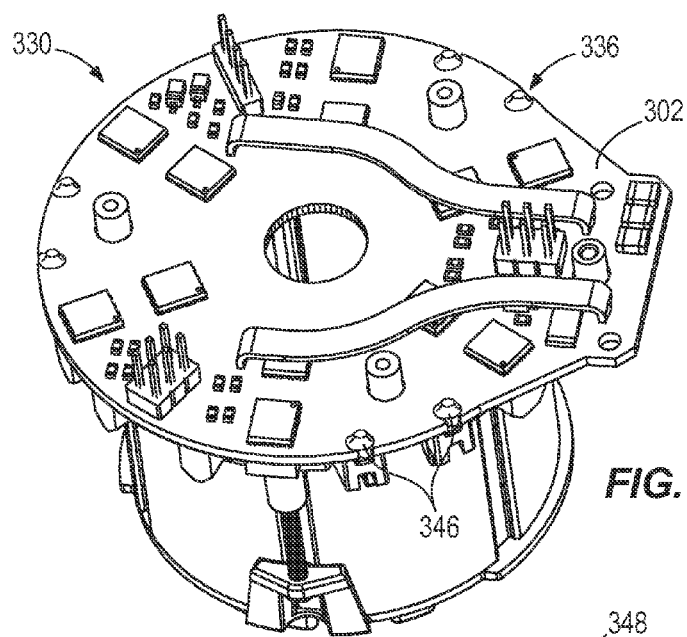

As illustrated in FIG. 19G, the motor leads 336 are soldered to the motor lead pads 322 to create solder joints 345, which not only electrically connect the motor leads 336 to the Hall and FET PCB 302, but also mechanically attach the two components together. After creating the solder joints 345, the motor leads 336 are cut near the motor lead pads 322. As described above, in addition to the solder joints 345, the Hall and FET PCB 302 can be secured to the heat sink 306 (which is secured to the motor 126) using Hall and FET PCB mounting screws.

After securing the Hall and FET PCB 302 to the motor 126 and heat sink 306 combination, the control PCB 304 is then secured to the heat sink 306 with the Hall and FET PCB 302 positioned between the heat sink 306 and the control PCB 304. The control PCB 304 is secured to the heat sink 306 using control PCB mounting screws received by the standoffs 305.

Figure 20:
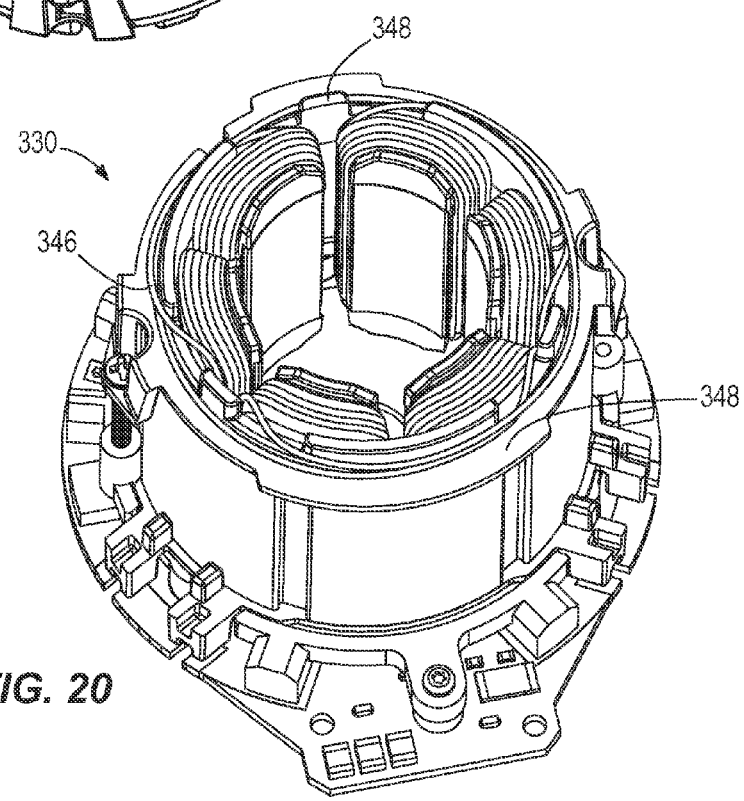
FIG. 20 illustrates a wire wrap technique for a brushless motor.

FIG. 20 illustrates the end of the motor stator 330 opposite from the end having the Hall and FET PCB 302. This view of the motor stator 330 illustrates a wire crossover design, which wraps a wire behind the plastic end cap 332. Wrapping the wires of the motor stator 330 around the plastic end cap 332 allows them to travel 180 degrees from one pole to the opposite pole of the motor stator 330 in an efficient manner. The wrapped wires 346 are on top of a ledge portion 348, which wraps around the motor stator 330, and are radially outside of tab portions 349 that extend up from the ledge portion 348. As illustrated, at no point are three wires located at the same circumferential position and stacked along the ledge portion 348. Rather, at most, two wires are stacked, allowing a reduced height of the tab portions 349 and overall length of the motor stator 330.

Figure 21:
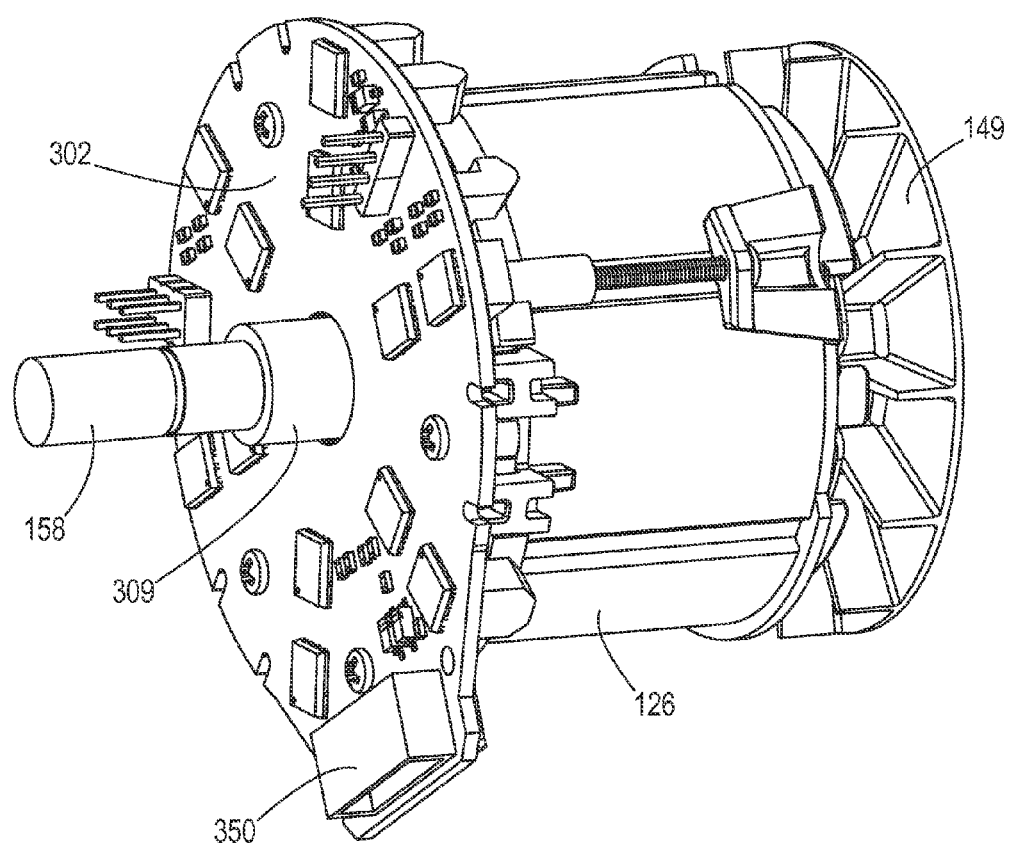
FIG. 21 illustrates another combined Hall sensor and FET PCB for use with a brushless power tool.

In some embodiments, the control PCB 304 is not located adjacent to the Hall and FET PCB 302 about the motor shaft 158, and the metal standoffs 305 do not pass through the Hall and FET PCB 302. Rather, the length of the metal standoffs 305 is reduced such that they terminate at the surface of the Hall and FET PCB 302. The reduced metal standoffs 305, which no longer provide spacing functionality, then receive Hall and FET PCB mounting screws to secure the Hall and FET PCB 302 to the heat sink 306 and motor 126 combination, as shown in FIG. 21.

In embodiments in which the control PCB 304 is not located adjacent to the Hall and FET PCB 302, the control PCB 304 may be referred to as the control PCB 304a. The control PCB 304a may be located in several locations within the power tool 300. The Hall and FET PCB 302 is coupled to the control PCB 304a via cable connector 350 and a ribbon cable (not shown).

FIGS. 22A-C illustrate exemplary locations within the power tool 300 that the control PCB 304a may be positioned. In FIG. 22A, similar to the power PCB 138 of the power tool 100, the control PCB 304a is located in the handle portion 258 of the power tool 300. In FIG. 22B, similar to the combined surfboard PCB 202, the control PCB 304a is located above the trigger 112 and handle portion 258, but below the motor 126 and impact mechanism 254. In FIG. 22C, similar to the control PCB 136 of the power tool 100, the control PCB 304a is located below the handle portion 258 and above the battery interface 114.

Although FIGS. 15-22 are described with respect to an impact wrench power tool 300, the various layout and motor assembly described may be implemented in other types of power tools, such as a non-hammer drill/driver power tool, a hammer drill/driver power tool (see, e.g., FIGS. 1-9) and an impact driver power tool (see, e.g., FIGS. 12-14).

The above power tools (e.g., power tools 200, 250, 270, and 300) are described as cordless, battery-powered tools. The battery packs, such as battery pack 301, used to power these power tools may be, for instance, 18 volt lithium ion type battery packs, although battery packs with other battery chemistries, shapes, voltage levels, etc. may be used in other embodiments. In some embodiments, these power tools are corded, AC-powered tools. For instance, in place of the battery interface 114 and battery pack, the power tools include an AC power cord coupled to a transformer block to condition and transform the AC power for use by the components of the power tools. These AC-powered tools may also include one of the above-described layouts including one of the combined surfboard PCB layouts and doughnut PCB layouts.

Thus, the invention provides, among other things, a layout design and assembly of brushless power tools. Various features and advantages of the invention are set forth in the following claims.

What is claimed is:

1. A power tool comprising:
   a housing;
   a brushless direct current (DC) motor within the housing and having a rotor and a stator, wherein the rotor is coupled to a motor shaft to produce a rotational output;
   a heat sink secured to an end of the brushless DC motor;
   a combined printed circuit board (PCB) having a Hall sensor, power switching elements, and a through-hole, wherein the combined PCB is
   coupled to the heat sink, and
   wherein the motor shaft extends through the through-hole; and
   a control PCB having a motor control unit that receives motor positional information from the Hall sensor and controls the power switching elements to drive the brushless DC motor, wherein the control PCB is secured to the heat sink and has a second through-hole through which the motor shaft extends.

2. The power tool of claim 1, wherein the heat sink has a third through-hole through which the motor shaft extends.

3. The power tool of claim 1, wherein the control PCB is located in one of a terminal block portion of the tool below a handle portion of the tool,
   the handle portion, and
   a location above a trigger of the power tool and below the brushless DC motor.

4. The power tool of claim 1, wherein the power tool is one of a hammer drill/driver, a drill/driver, an impact driver, and an impact wrench.

5. The power tool of claim 1, further comprising a fan positioned at a rear end opposite the end of the brushless DC motor to which the heat sink is secured, wherein the fan is rotatable by the brushless DC motor to generate a cooling air flow within a housing of the power tool.

6. A power tool comprising:
   a housing;
   a brushless direct current (DC) motor within the housing and having a rotor and a stator, wherein the rotor is coupled to a motor shaft to produce a rotational output;
   an output unit coupled to the motor shaft to provide the rotational output outside of the housing;
   a combined printed circuit board (PCB) having a Hall sensor, power switching elements, and a through-hole, wherein the combined PCB is positioned between the brushless DC motor and the output unit and wherein the motor shaft extends through the through-hole; and
   a control PCB having a motor control unit that receives motor positional information from the Hall sensor and controls the power switching elements to drive the brushless DC motor.

7. The power tool of claim 6, wherein the control PCB has a second through-hole through which the motor shaft extends.

8. The power tool of claim 6, wherein the control PCB is located in one of a terminal block portion of the tool below a handle portion of the tool,
   the handle portion, and
   a location above a trigger of the power tool and below the brushless DC motor.

9. The power tool of claim 6, wherein a heat sink is positioned between brushless DC motor and the combined PCB.

10. The power tool of claim 9, wherein the heat sink has a third through-hole through which the motor shaft extends.

11. The power tool of claim 6, further comprising a fan positioned at a rear end of the brushless DC motor opposite the combined PCB, wherein the fan is rotatable by the brushless DC motor to generate a cooling air flow within the housing.

12. The power tool of claim 6, wherein the power tool is one of a hammer drill/driver, a drill/driver, an impact driver, and an impact wrench.

13. A power tool comprising:
- a trigger for activating the power tool;
- a housing having a handle portion and a motor housing portion;
- a brushless direct current (DC) motor located within the motor housing portion and having a rotor and a stator, wherein the rotor is coupled to a motor shaft to produce a rotational output;
- a combined printed circuit board (PCB) having components exposed within the housing including a motor control unit and power switching elements, wherein the combined PCB is positioned between the trigger and the brushless DC motor, and wherein the motor control unit controls the power switching elements to drive the brushless DC motor; and
- a fan positioned on the motor shaft of the brushless DC motor, wherein the fan is rotatable by the brushless DC motor to generate a cooling air flow within the housing to cool the components of the combined PCB.

14. The power tool of claim 13, further comprising a heat sink on a first side of the combined PCB for cooling the power switching elements, wherein the power switching elements are mounted on a second side of the combined PCB opposite the first surface.

15. The power tool of claim 13, wherein the combined PCB has an elongated shape, with a rear portion adjacent to the brushless DC motor and a front portion adjacent to a trigger of the power tool.

16. The power tool of claim 13, further comprising a Hall sensor PCB positioned adjacent to the brushless DC motor and including a Hall sensor that detects motor position, the Hall sensor PCB being electrically coupled to the combined PCB such that the Hall sensor is operable to output motor position information to the motor control unit.

17. The power tool of claim 13, wherein a mounting surface plane of the Hall sensor PCB is generally perpendicular to a mounting surface plane of the combined PCB.

18. The power tool of claim 13, wherein the power tool is one of a hammer drill/driver, a drill/driver, and an impact driver.

19. The power tool of claim 13, further comprising:
- a forward/reverse switch mounted on the combined PCB; and
- a work light mounted on the combined PCB.

20. The power tool of claim 13, wherein the power tool is an impact wrench.

* * * * *